(12) United States Patent
Vidra et al.

(10) Patent No.: US 10,573,506 B2
(45) Date of Patent: Feb. 25, 2020

(54) METHOD AND DEVICE FOR ETCHING PATTERNS INSIDE OBJECTS

(71) Applicants: Michael Vidra, Export, PA (US); Robert Vaccaro, Greensburg, PA (US); Edward Palanko, New Stanton, PA (US); Mark Megela, Mount Pleasant, PA (US)

(72) Inventors: Michael Vidra, Export, PA (US); Robert Vaccaro, Greensburg, PA (US); Edward Palanko, New Stanton, PA (US); Mark Megela, Mount Pleasant, PA (US)

( * ) Notice: Subject to any disclaimer, the term of this patent is extended or adjusted under 35 U.S.C. 154(b) by 0 days.

(21) Appl. No.: 16/163,904

(22) Filed: Oct. 18, 2018

(65) Prior Publication Data

US 2019/0051514 A1    Feb. 14, 2019

Related U.S. Application Data

(63) Continuation-in-part of application No. 15/457,313, filed on Mar. 13, 2017, now Pat. No. 10,399,240.
(Continued)

(51) Int. Cl.
*H01L 21/02* (2006.01)
*G02B 27/09* (2006.01)
(Continued)

(52) U.S. Cl.
CPC ......... *H01L 21/02019* (2013.01); *B23H 3/00* (2013.01); *B23K 26/0006* (2013.01); *B23K 26/046* (2013.01); *B23K 26/0622* (2015.10); *B23K 26/0823* (2013.01); *B23K 26/0869* (2013.01); *B23K 26/103* (2013.01); *B23K 26/352* (2015.10); *B23K 26/355* (2018.08);
(Continued)

(58) Field of Classification Search
None
See application file for complete search history.

(56) References Cited

U.S. PATENT DOCUMENTS 5,667,707 A    9/1997 Klingel et al.
6,353,203 B1   3/2002 Hokodate et al.
(Continued)

FOREIGN PATENT DOCUMENTS

CN    103260813 A   8/2013
CN    206455309 U   9/2017
(Continued)

*Primary Examiner* — Jiong-Ping Lu
(74) *Attorney, Agent, or Firm* — Cohen & Grigsby, P.C.

(57) ABSTRACT

Systems and methods for etching complex patterns on an interior surface of a hollow object are disclosed. A method generally includes positioning a laser system within the hollow object with a focal point of the laser focused on the interior surface, and operating the laser system to form the complex pattern on the interior surface. Motion of the laser system and the hollow object is controlled by a motion control system configured to provide rotation and/or translation about a longitudinal axis of one or both of the hollow object and the laser system based on the complex pattern, and change a positional relationship between a reflector and a focusing lens of the laser system to accommodate a change in distance between the reflector and the interior surface of the hollow object.

19 Claims, 11 Drawing Sheets

Related U.S. Application Data

(60) Provisional application No. 62/306,954, filed on Mar. 11, 2016.

(51) Int. Cl.

| | | |
|---|---|---|
| *H01S 5/00* | (2006.01) | |
| *G02B 27/30* | (2006.01) | |
| *B23K 26/352* | (2014.01) | |
| *B23K 26/362* | (2014.01) | |
| *B23K 26/402* | (2014.01) | |
| *B23H 3/00* | (2006.01) | |
| *B26D 7/26* | (2006.01) | |
| *B26D 3/08* | (2006.01) | |
| *C23F 1/00* | (2006.01) | |
| *C23F 1/02* | (2006.01) | |
| *C23F 1/04* | (2006.01) | |
| *B23K 26/0622* | (2014.01) | |
| *B23K 26/10* | (2006.01) | |
| *B23K 26/40* | (2014.01) | |
| *B23K 26/08* | (2014.01) | |
| *B23K 26/046* | (2014.01) | |
| *B23K 26/00* | (2014.01) | |

(52) U.S. Cl.
CPC ............ *B23K 26/362* (2013.01); *B23K 26/40* (2013.01); *B23K 26/402* (2013.01); *B26D 3/08* (2013.01); *B26D 7/2614* (2013.01); *C23F 1/00* (2013.01); *C23F 1/02* (2013.01); *C23F 1/04* (2013.01); *G02B 27/0955* (2013.01); *G02B 27/0977* (2013.01); *G02B 27/30* (2013.01); *H01L 21/02675* (2013.01); *H01S 5/0085* (2013.01)

(56) References Cited

U.S. PATENT DOCUMENTS

| | | |
|---|---|---|
| 6,573,473 B2 | 6/2003 | Hunter et al. |
| 6,720,567 B2 | 4/2004 | Fordahl et al. |
| 6,949,215 B2 | 9/2005 | Yamada et al. |
| 6,960,740 B2 | 11/2005 | Giloh |
| 7,938,175 B2 | 5/2011 | Skinner et al. |
| 8,410,395 B2 | 4/2013 | Mienhardt |
| 8,723,076 B2 | 5/2014 | Alpay et al. |
| 8,796,582 B2 | 8/2014 | Kawai et al. |
| 10,399,240 B2 * | 9/2019 | Vidra ................... B23K 26/362 |
| 2009/0147226 A1 * | 6/2009 | Horiuchi ................... G03F 7/24 355/53 |
| 2013/0200052 A1 | 8/2013 | Wittner |
| 2017/0350000 A1 | 12/2017 | Kekkonen et al. |

FOREIGN PATENT DOCUMENTS

| | | |
|---|---|---|
| EP | 1 567 301 B1 | 9/2008 |
| FR | 2 564 349 A1 | 11/1985 |
| GB | 2393511 B | 3/2004 |
| JP | 7032182 A | 2/1995 |
| JP | 2009269084 A | 11/2009 |
| JP | 2011031275 A | 2/2011 |

* cited by examiner

METHOD AND DEVICE FOR ETCHING PATTERNS INSIDE OBJECTS

RELATED APPLICATIONS

This application is a continuation-in-part of U.S. application Ser. No. 15/457,313, filed Mar. 13, 2017, now U.S. Pat. No. 10,399,240, which claims the benefit under 35 U.S.C. § 119(e) of prior U.S. provisional application Ser. No. 62/306,954, filed Mar. 11, 2016, the entire disclosures of which are incorporated herein by reference.

FIELD OF THE INVENTION

The present invention relates to methods and devices for generating etched patterns on an interior surface of a hollow object, including objects with restricted access or space limited openings.

BACKGROUND OF THE INVENTION

Etching processes such as chemical etching and electro-chemical etching can be used to carve into the exteriors of ferrous alloy or other metal objects which are not easily engraved by other means. Etching, sometimes referred to as milling, uses corrosive chemicals or electric current to engrave patterns into a substrate. Generally, a masking material or coating is applied to the substrate and removed from areas that are to be etched. The substrate may then be exposed to an etchant to form a desired pattern in the substrate.

In chemical etching processes, the coatings are resistant to the corrosive properties of a chemical etchant. For electro-chemical etching, or EChE, the coating is electrically non-conductive, and is thus resistant to ablation of the substrate surface by an electric current. For example, in an EChE process, an electric circuit is established with a suitable cathode fixed at a desired distance from the substrate, which acts as the anode. An electrolyte compatible with both anode and cathode materials is introduced between the cathode and anode, and then current is passed through the circuit. Metal ions from the exposed portions of the substrate are dissolved or dislocated into the electrolyte at a rate proportional to the current applied.

In all etching methods, the coating needs to be removed from the substrate in the desired pattern so that exposure to the etchant may remove a portion of the substrate. For non-uniformly shaped objects, such as an exterior of a three dimensional object, this may not be a straight-forward process. Furthermore, removing the coating in a pattern has generally not been possible on interior surfaces of certain objects such as hollow objects due to the lack of appropriate tools and processes. That is, no technology for scribing and etching the internal surfaces of hollow, three-dimensional objects or shapes composed of ferrous alloy or other substrate is readily available.

SUMMARY OF THE INVENTION

The presently disclosed invention provides methods and devices for etching patterns onto the interior surface of a hollow object. The methods and devices are adaptable for use in the hollow interior of any shaped object and may be used to create any style of pattern, whether to facilitate a particular use for the finished object or to achieve a particular interior aesthetic.

Accordingly, the present invention includes a laser machining apparatus for machining an inner surface of a hollow object. Machining may include removal or deposition of materials such as laser ablation, laser cutting, laser welding, etc. The apparatus comprises a laser source configured to output a collimated laser beam; a focusing lens for focusing the laser beam to provide a focal length (f); a reflector for changing a direction of the laser beam; and an adjustment mechanism for changing a distance (A) between the focusing lens and the reflector, wherein the adjustment mechanism allows a distance (B) between the reflector and a work piece to be varied without changing the focal length (f) of the laser beam.

According to certain aspects of the presently disclosed laser machining apparatus, the adjustment mechanism may comprise an inner tube having the focusing lens mounted therein, and an outer tube having the reflector mounted therein, wherein the inner tube is configured to move within the outer tube to change the distance (A).

According to certain aspects of the presently disclosed laser machining apparatus, the inner tube may comprise a collimator at a proximal end and the focusing lens at a distal end, and the outer tube may comprise the reflector at a distal end, wherein the inner tube is nested within the outer tube so that the focusing lens is proximal to the reflector, and the inner tube is configured for linear motion within the outer tube. The linear motion may be actuated by a ball screw controlled by a servo motor, which may be in electronic communication with a server. The server may be configured to receive dimensional data of an internal shape of the hollow object, and to control the servo motor based on the dimensional data.

According to certain aspects of the presently disclosed laser machining apparatus, the apparatus may further comprise a position sensing device configured to measure the distance (B) between the reflector and the work piece, wherein the adjustment mechanism (e.g., the servo motor) is configured to change the distance (A) between the focusing lens and the reflector based on the distance (B) measured by the position sensing device.

The present invention further includes a system for patterning an inner surface of a hollow object. The system comprises a mounting stage configured to securely mount the hollow object and provide rotational movement about a longitudinal axis of the hollow object; and any of the laser machining or mechanical scribing devices as detailed herein, wherein the scribing or machining devices are configured to fit within an interior of the hollow object. A path of the one or more scribing blades of the scribing device or the laser of the laser machining device in any direction (i.e., x, y, or z of a coordinate axis); rotational and/or longitudinal movement of the hollow object; rotational and/or longitudinal movement of the mounting stage; or any combination thereof, may be controlled manually or by an automated controller.

The present invention also includes a method for generating a patterned design onto an inner surface of a hollow object. The method comprises applying to the inner surface of the hollow object a layer of coating which resists corrosive chemical etchants; removing a portion of the coating from the inner surface in the patterned design; etching the inner surface of the hollow object in the patterned design; and stripping a remaining portion of the coating from the inner surface of the hollow object to reveal the patterned design.

The present invention also includes an additional method for generating a patterned design onto an inner surface of a hollow object. The method comprises applying to the inner surface of the hollow object a layer of coating which acts as an electrical insulator; removing a portion of the coating from the inner surface in the patterned design; electrochemically etching the inner surface of the hollow object in the patterned design; and stripping a remaining portion of the coating from the inner surface of the hollow object to reveal the patterned design According to certain aspects of the presently disclosed methods, removing the portion of the coating in the patterned design is by mechanical scribing, laser ablation, photoresist imaging and developing or a combination thereof. In cases where the coating is a photoresist, removing the portion of the coating in the patterned design is by laser treatment of the photoresist, which may be followed by developing and hardening steps to remove the treated photoresist and harden the untreated photoresist, or vice versa, depending on the type of photoresist. The photoresist material may be resistant to chemical etchants and/or an electrical insulator.

According to certain aspects of the presently disclosed methods, etching the inner surface in the patterned design is by applying a corrosive agent which chemically mills the patterned design in the inner surface, or by electrochemical etching which uses electric current to mill the patterned design. According to certain aspects of the presently disclosed methods, etching the inner surface in the patterned design is by laser ablation or vaporization of the material of the inner surface in the pattered design.

The present invention also relates to methods for forming an etched pattern on an interior surface of a hollow object. According to certain aspects, the method comprises positioning a laser system within a hollow object so that a focal point of the laser system is focused on an interior surface of the hollow object; operating the laser system to form a complex pattern on the interior surface of the hollow object, wherein motion of one or both of the laser system and the hollow object is controlled by a motion control system so that the laser system forms the complex pattern on the interior surface of the hollow object; and changing a positional relationship between a reflector of the laser system and a focusing lens of the laser system to accommodate a change in a distance between the reflector and the interior surface of the hollow object so that the focal point remains focused on the interior surface, wherein the change in the distance between the reflector and the interior surface of the hollow object is caused by a non-uniform shape of the interior surface. The motion control system may be configured to provide rotation about the longitudinal axis and translation along the longitudinal axis for one or both of the hollow object and the laser system based on the complex pattern.

According to certain aspects of the presently disclosed methods for forming an etched pattern, the adjustment provided by the motion control system may be inversely proportional to the distance between the reflector of the laser system and the interior surface of the hollow object. Moreover, the adjustment may be based on real-time dimensional data of the distance between the reflector and the interior surface of the hollow object collected by a position sensing device attached to the laser system. The adjustment may be based on dimensional data of an interior shape of the hollow object stored on a server.

The present invention also relates to methods for forming an etched pattern on an interior surface of a hollow object. According to certain aspects, the method comprises positioning a laser system within a hollow object so that a focal point of the laser system is focused on an interior surface of the hollow object; and operating the laser system to machine a complex pattern on the interior surface of the hollow object. According to certain aspects, the machining may comprise deposition of material or ablation of material. Motion of the laser system and the hollow object may be controlled by a motion control system configured to: provide rotation about a longitudinal axis and translation along the longitudinal axis for one or both of the hollow object and the laser system based on the complex pattern; and change a positional relationship between a reflector of the laser system and a focusing lens of the laser system to accommodate a change in a distance between the reflector and the interior surface of the hollow object so that the focal point of the laser system remains focused on the interior surface. The change in the positional relationship between the reflector and the focusing lens is based on real-time dimensional data of the distance between the reflector and the interior surface of the hollow object collected by a position sensing device attached to the laser system, or based on dimensional data of an internal shape of the hollow object stored on a server.

According to certain aspects of the presently disclosed methods for forming an etched pattern, the laser system may include an inner tube comprising the focusing lens at a distal end and a collimator at a proximal end, and an outer tube comprising the reflector at a distal end, wherein the inner tube is nested within the outer tube with the focusing lens proximal to the reflector, and wherein changing the positional relationship between the reflector and the focusing lens is moving the distal end of the inner tube closer to the distal end of the outer tube such as, for example, by actuation of a ball screw controlled by a motor.

The present invention also relates to methods for forming a complex pattern on an interior surface of a hollow object having a small opening. According to certain aspects, the method comprises passing a laser system through the small opening of the hollow object so that a focal point of the laser system is focused on the interior surface of the hollow object. The laser system generally comprises a reflector to angle the focal point with respect to a longitudinal axis of the laser system onto the interior surface of the hollow object, such as by an angle of about 30° to 150°, or about 45° to 135°, or about 60° to 120°, or about 75° to 105°, or about 90°. the method further comprises providing rotational and translational movement along a longitudinal axis for one or both of the hollow object and the laser system based on the complex pattern, and operating the laser system to form the complex pattern on the interior surface of the hollow object, wherein forming the complex pattern comprises deposition of material or ablation of material in the complex pattern. The method further comprises changing a longitudinal distance between the reflector of the laser system and a focusing lens of the laser system to accommodate a change in a lateral distance between the reflector and the interior surface of the hollow object so that the focal point remains focused on the interior surface, wherein the change in the distance is caused by a non-uniform shape of the interior surface of the hollow object, and wherein a diameter of the small opening of the hollow object is 90%, 80%, 70%, 60%, 50%, 40%, 30%, 20%, 10% or less than an interior diameter of the hollow object.

BRIEF DESCRIPTION OF THE DRAWINGS

Aspects, features, benefits and advantages of the embodiments herein will be apparent with regard to the following description, appended claims, and accompanying drawings. In the following figures, like numerals represent like features

DETAILED DESCRIPTION OF THE INVENTION

Figure 1A:
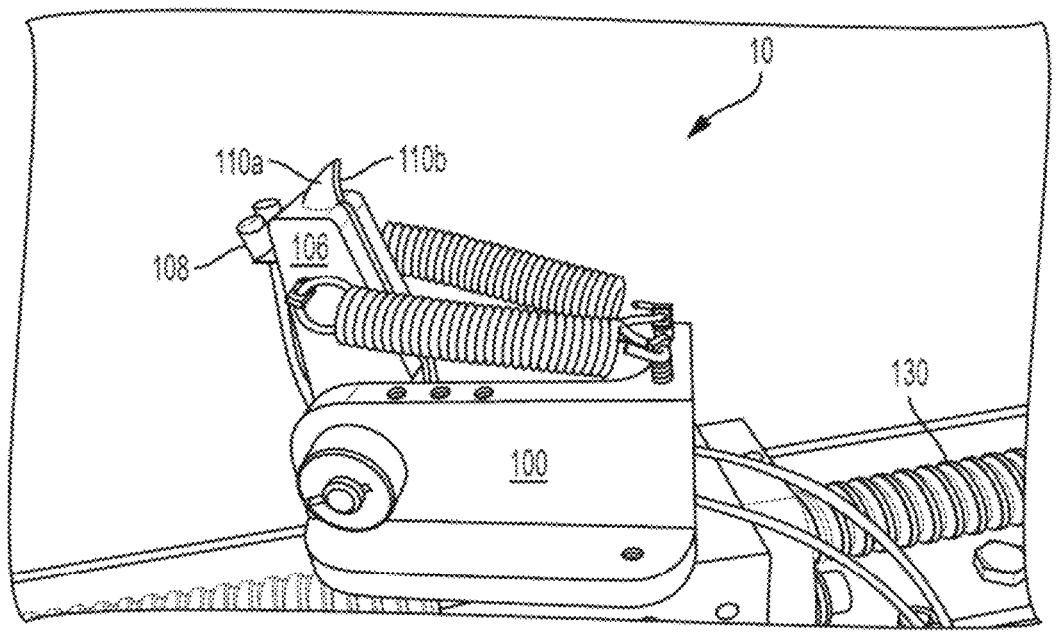
FIG. 1A illustrates a side perspective view of a mechanical scribing device in an engaged position in accordance with certain aspects of the presently disclosed invention.

In the following description, the present invention is set forth in the context of various alternative embodiments and implementations involving methods and devices for etching patterns on an inner surface of a hollow object. Such etching methods generally employ the use of a mechanical blade(s), a laser, or photoresist imaging and developing processes to cut, image, or scribe patterns into protective coatings on the inner surface of a hollow object, such as a hollow metal object, thus exposing the underlying material. The coating and pattern forming processes may be followed by the application of agents which chemically or electrically dissolve the material which is exposed in the scribed pattern. Alternatively, material may be built up in the scribed pattern on the inner surface. While the following description discloses numerous exemplary embodiments, the scope of the present patent application is not limited to the disclosed embodiments, but also encompasses combinations of the disclosed embodiments, as well as modifications to the disclosed embodiments.

Various aspects of the device may be illustrated by describing components that are coupled, attached, and/or joined together. As used herein, the terms "coupled", "attached", and/or "joined" are interchangeably used to indicate either a direct connection between two components or, where appropriate, an indirect connection to one another through intervening or intermediate components. In contrast, when a component is referred to as being "directly coupled", "directly attached", and/or "directly joined" to another component, there are no intervening elements shown in said examples.

Various aspects of the method and device may be described and illustrated with reference to one or more exemplary implementations. As used herein, the term "exemplary" means "serving as an example, instance, or illustration," and should not necessarily be construed as preferred or advantageous over other variations of the devices, systems, or methods disclosed herein. "Optional" or "optionally" means that the subsequently described event or circumstance may or may not occur, and that the description includes instances where the event occurs and instances where it does not. In addition, the word "comprising" as used herein means "including, but not limited to".

Relative terms such as "lower" or "bottom" and "upper" or "top" may be used herein to describe one element's relationship to another element illustrated in the drawings. It will be understood that relative terms are intended to encompass different orientations of aspects of the device in addition to the orientation depicted in the drawings. By way of example, if aspects of the device in the drawings are turned over, elements described as being on the "bottom" side of the other elements would then be oriented on the "top" side of the other elements as shown in the relevant drawing. The term "bottom" can therefore encompass both an orientation of "bottom" and "top" depending on the particular orientation of the drawing.

It must also be noted that as used herein and in the appended claims, the singular forms "a", "an", and "the" include the plural reference unless the context clearly dictates otherwise. Unless defined otherwise, all technical and scientific terms used herein have the same meanings as commonly understood by one of ordinary skill in the art.

Terms such as "substantially parallel" or "substantially perpendicular" may be taken to indicate an angle that is within 20° of the recited angle. Thus, substantially perpendicular, for example, may be taken to mean an angle of 90°±20°, such as 90°±10°, or even 90°±5°.

The term "etch" may be used herein to indicate that a pattern may be formed on a surface of a substrate, wherein the pattern may include removal or deposition of material. According to certain aspects of the presently disclosed methods and systems, removal of the material from the surface of the substrate may include use of a chemical etchant, electrochemical etchant, vaporization or ablation of material using a laser, or any combination thereof.

The presently disclosed invention includes methods for etching patterns inside a hollow object. The method may comprise the following sequence: i) Surface preparation such as object pre-cleaning, and coating the interior (and if necessary, exterior) of the object; ii) Pattern generation by one of a) mechanical or manual scribing and peeling, b) laser ablation, or c) photoresist coating and laser (or other light source) exposure, development and hardening; iii) Etching by either chemical or electrical methods; and iv) Finishing the etched object, wherein finishing may include coating removal, surface passivation, and/or protectant application. The various steps in the method are further detailed below.

i) Surface Preparation and Coating

Objects to be etched by methods and devices of the present invention include an internal hollow region accessible through at least one opening, such as the inner surface of a cylinder or container. The objects may be formed of any durable material known in the art, such as glass, metal, metal alloys, silicon containing materials, and/or durable polymers. For example, the objects may be formed of transition metals and post-transition metals such as iron, gold, silver, platinum, nickel, ruthenium, palladium, molybdenum, chromium, copper, tantalum, titanium, tungsten, zinc, aluminum, indium, tin, gallium, lead, and alloys of these metals such as steel, brass, bronze, gallium arsenide, and indium tin oxide. Furthermore, the objects may be formed of more than one material. For example, the objects may include different materials forming the inner and outer surfaces thereof.

The objects may include a protective layer ("protectant") which prevents damage or oxidation during storage and/or transport. For example, protectants commonly used to prevent metal corrosion during shipment may be composed of oil, grease, polymer films or other oxide films. These protectants may chemically interfere with etching or interior coating adhesion. Consequently, these protectants may be chemically or mechanically removed prior to coating. Typical chemical removal involves either dissolving the protectant in a compatible solvent solution, or reacting the protectant with a suitable chemical followed by rinsing, as with commercial detergent solutions. Protectants may also be mechanically removed by surface grit-blasting and/or high pressure rinsing.

In order to prevent unwanted etching and oxidation on the outside surfaces of the object, the object exterior may be dipped in, rolled, or sprayed with, a selected coating that is resistant to the selected etchant. Depending on the solids content of the selected coating, multiple applications may be necessary, allowing for sufficient drying time between applications. The coatings used are generally customized to protect the object from the selected etchant while avoiding any harm to the underlying material of the object.

Several methods facilitate internal object coating. One exemplary method is spraying the selected coating into the hollow interior of the object while the object is fixed on a support platform, such as a rotating apparatus. A spray head may be mounted on an extension tool allowing insertion into openings that are too restrictive for a spray gun itself to be inserted. The coating may be applied by inserting the spray gun (or spray head on the extension) into the object, initiating object rotation, activating the spray, and withdrawing the spray gun (or spray head on the extension). The spray may be deactivated as the spray head or gun exits the object. The object may continue to rotate until the coating dries to the point that it will no longer run or sag. This process may be manual or automated using a programmable controller.

Coating thickness may be adjusted by altering the speed at which the spray gun (or spray head) is withdrawn, and/or changing the parameters of the spray gun (e.g., spray pressures, spray tip orifice, and coating viscosity). The rotation speed may be varied to achieve uniform coating distribution and thickness. The extraction speed, spray parameters and rotational speed are generally determined based on the particular coating characteristics and object dimensions.

Alternatively, internal coating of the object may be achieved by pouring the selected coating into the hollow interior of the object while the object is fixed on the rotating apparatus. The object may be rotated at a speed sufficient to permit uniform coating distribution and thickness. Numerous layers of coating may be applied to the hollow interior of the object, depending on the desired coating thickness and the coating properties. Furthermore, depending on the viscosity of the coating and diameter of the object, the rotational speed may require further optimization, with thicker coatings requiring slower rotational speeds than thinner coatings, and larger diameter objects requiring slower rotational speeds than smaller diameter objects.

Another method for internal coating of container-like objects is to completely fill the hollow interior with the selected coating, followed by removal of excess coating. The selected coating may be removed, for example, by placing the hollowed object upside down, thus allowing the excess coating to drain from the hollow interior through the opening. The coating thickness may be influenced by changing the coating viscosity and the amount of time it is allowed to remain in the hollow interior of the object. Several repetitions of this process may be necessary to build the desired coating thickness.

After each application, the coating may be allowed to cure in a manner which prevents damage to the preceding application, and/or which does not inhibit future applications. The term "cure", as used in connection with a cured coating, means that at least a portion of the components that form the coating are polymerized, cross-linked, or dried to form a hardened film. Curing or drying reactions to form the hardened film may be carried out under ambient conditions, or may be carried out at elevated temperatures, pressures, or in the presence of various gases. For example, the coating may comprise a solvent which may be evaporated to dry or cure the coating. The solvent evaporation may be accelerated by vacuum removal coupled with fresh air or inert gas supply. Depending upon the nature of the chosen coating, internal or external heat sources may be used to accelerate drying. Further, for certain coating chemistries, additional processing steps (imaging, hardening, fixing, etc.) may be necessary to make the coating fully resistant to the targeted etching solution.

According to certain aspects of the presently disclosed invention, the hollow objects may be heated prior to application of the coating. For example, the hollow objects may be heated to a temperature of between 140° C.-200° C., such as 150° C.-175° C., or even 160° C.-165° C. by any means known in the art (e.g., heating in oven, induction heating, etc.) prior to application of the coating. Application of the coating on the pre-heated hollow object may provide a faster cure of the coating, and a more uniform build of the coating.

For objects which are to be mechanically scribed and peeled, an additional application of coating may be added after the correct thickness is achieved, or nearly achieved. This top application may be harder and of higher cohesive strength than the previous coating layer(s), and may improve mechanical peeling.

For objects which are to be patterned by laser ablation, wherein a laser is utilized to remove the coating, an appropriate colorant or dye may be added to the coating formula to reduce the transparency of the coating to the primary wavelength of the ablation laser, thereby maximizing energy absorption and improving process efficiency. Further, the thickness of the coating may be matched to the characteristics of the laser ablation equipment. In general, the thinnest application that allows for full protection during the chemical or electrical milling step is desired, as thinner coatings require less drying time, less coating material, lower laser intensities, and less time stripping the coating after etching is complete.

For objects which are to be patterned using photoresist, the photoresist may be applied to the inner surface of the object. Photoresist is a photosensitive coating that changes properties when exposed to light, either gaining or losing resistance to attack by an etchant or solvent in the areas exposed to electromagnetic radiation, most commonly in the UV light spectrum. The thickness and properties of the photoresist may be matched to the equipment used for exposure of the pattern onto the photoresist (e.g., photoresist may be chemically resistant and/or electrically non-conductive).

For objects which are to be etched using a chemical etchant, the coating may be a coating resistant to the chemical etchant. Moreover, for objects that are to be etched using EChE, the coating may be an electrically non-conductive masking material or coating.

While several methods for coating the interior surface of the object have been described herein, other methods known in the art are within the scope of the present invention. Furthermore, more than one coating layer may be applied to the inner surface of the object, wherein each coating layer may vary in thickness and identity of the coating material. As previously indicated, selection of the specific coating thickness and coating material may depend on at least the nature of the object to be coated (i.e., material of the object), and/or on the method of pattern generation to be used in future steps of the process.

According to certain aspects of the presently disclosed invention, the thickness of the coating may be substantially uniform on the interior surface of the object. For example, the coating used in a laser ablation process would be optimized to be as thin as possible to facilitate complete and uniform removal. Conversely, the coating used in a mechanical scribe and peel process would be thicker because the cohesive strength of the coating is relied upon to promote easy peeling of the coating.

ii) Pattern Generation

The term "pattern generation" generally describes various methods and implementations used to remove a portion of the coating from the internal surface of the hollow object according to a specific pattern or design. The pattern may be preset or programmed into a computer (e.g., translated from CAD drawings) which directs the movements of the various devices used to remove the portion of coating and movements of the hollow object, either together or individually.

Figure 6A:
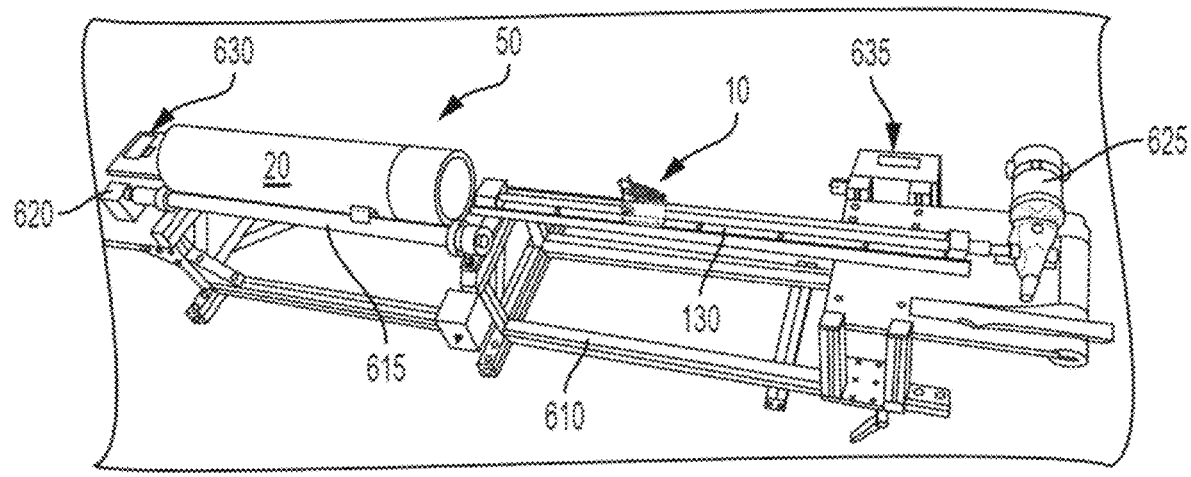
FIG. 6A illustrates a system for scribing an inner surface of a hollow object in accordance with certain aspects of the present invention, wherein a scribing device of the system is not yet engaged within the inner surface of the hollow object.
Figure 6B:
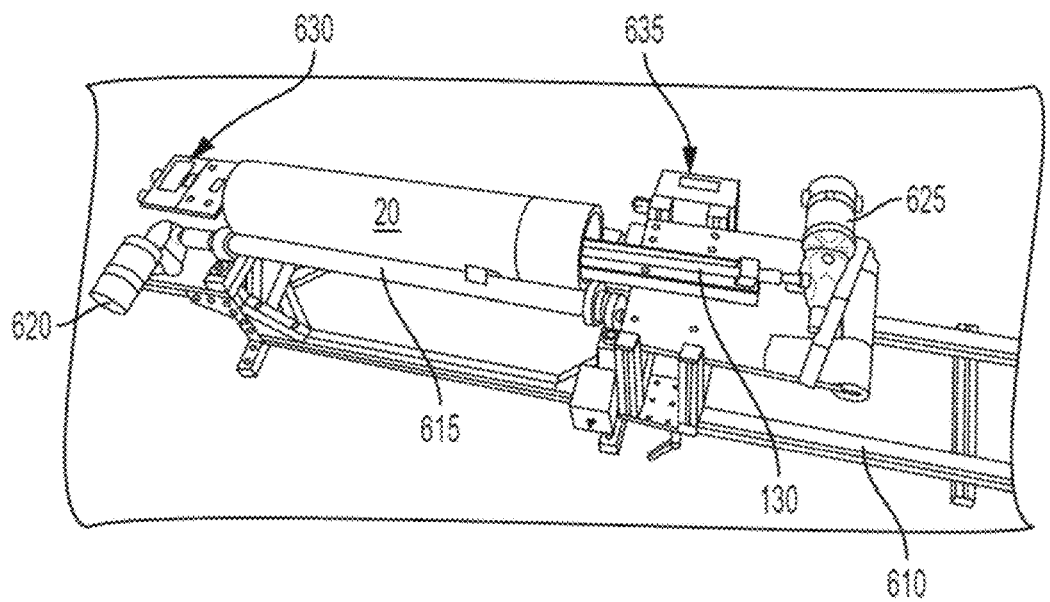
FIG. 6B illustrates the system shown in FIG. 6A, wherein the scribing device is engaged within the inner surface of the hollow object.

A scribing device, be it a mechanical or laser device, may be included as part of a larger system which includes a rotating apparatus 50, as illustrated in FIGS. 6A and 6B. Shown in FIG. 6A is a hollow cylindrical object 20 which is supported on roller bar(s) 615 on one end of a mounting stage 610. The object 20 may rest on and be rotated by the roller bar(s) 615. In certain instances, the object 20 may be secured, such as on a support or on the roller bar(s) 615 by a strap or belt (not shown). Rotation of the object 20 on the roller bar(s) 615 may be driven by a motor 620. A scribing device, such as the mechanical scribing device 10 shown in FIGS. 1A-1D, or a laser machining device as shown in FIGS. 2A-2E, 8A-8C, and 9A-9C, may be included at an opposite end of the mounting stage 610. Also shown in FIG. 6A is a rail 130 which may provide lateral movement of the scribing device (along longitudinal axis of the rail), and which may be rotated by a motor 625. Either, or both, motor 620 and 625 may be manually or automatically controlled, such as by speed controllers 630 and 635, respectively.

Show in FIG. 6B is the mechanical scribing device 10 positioned within the interior of the hollow object 20. Movement of the mechanical scribing device 10 laterally to any position within the interior of the object 20 may be motor controlled, either manually or automatically. While it is shown that mechanical scribing device 10 has longitudinal movement on the mounting stage 610, it is also possible that the hollow object 20 may be moved longitudinally on the mounting stage 610, or both the device 10 and the object 20 may have longitudinal movement on the mounting stage 610. Furthermore, either or both of the mechanical scribing device 10 and the mounting stage 610 may provide movement in other directions, such as perpendicular to a longitudinal axis of the rotating apparatus 50 and/or the rail 130 ("sideways" or "up-down" movements). Moreover, while a mechanical scribing device (10) is shown in FIGS. 6A and 6B, any of the laser machining devices detailed herein may be substituted to provide means for patterning the interior surface of the hollow object.

Figure 2E:
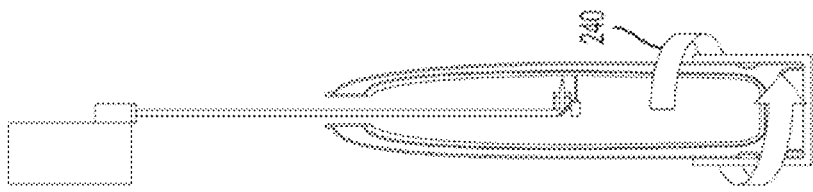
FIGS. 2A-2E illustrate various stages of a process for use of a laser scribing device in accordance with certain aspects of the presently disclosed invention.
Figure 2D:
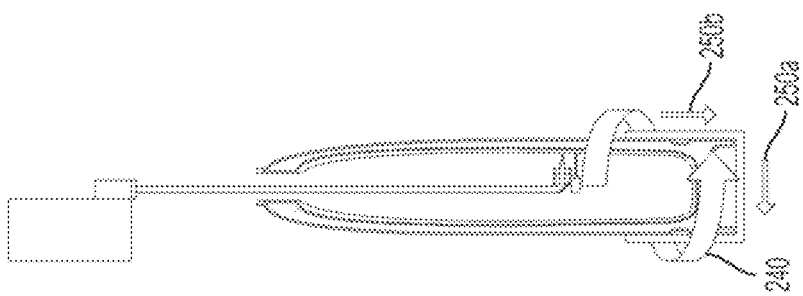
Figure 2C:
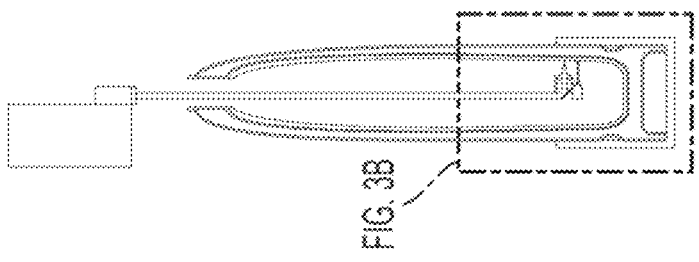
Figure 2B:
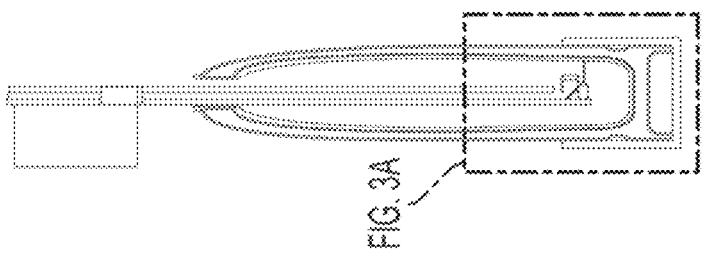
Figure 2A:
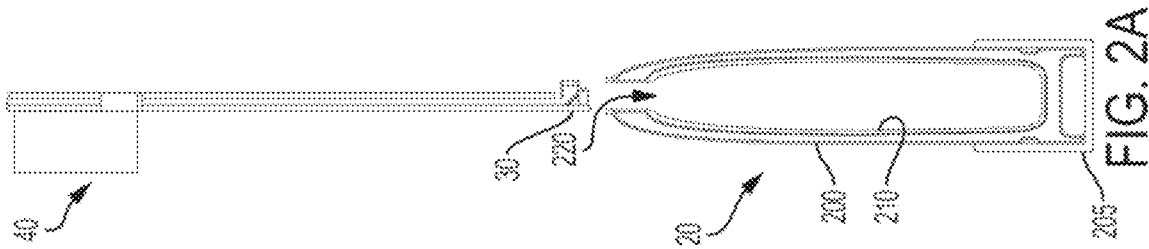
Figure 3B:
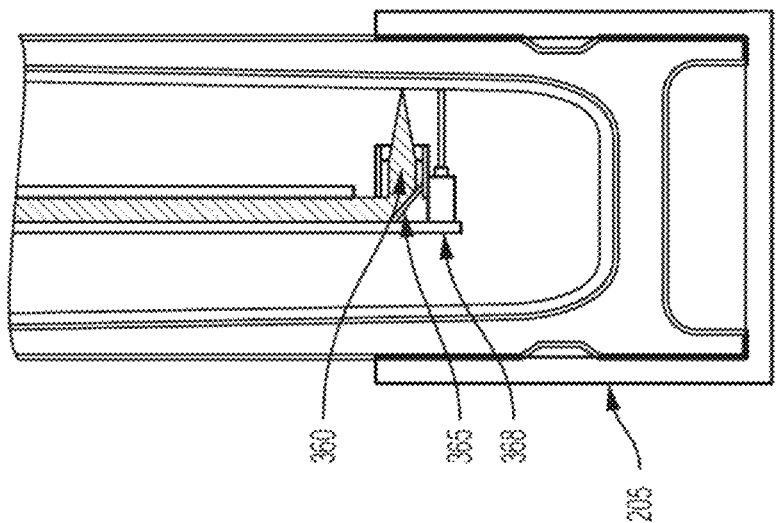
FIGS. 3A and 3B illustrate close-up views of the laser scribing device shown in FIGS. 2B and 2C, respectively.
Figure 3A:
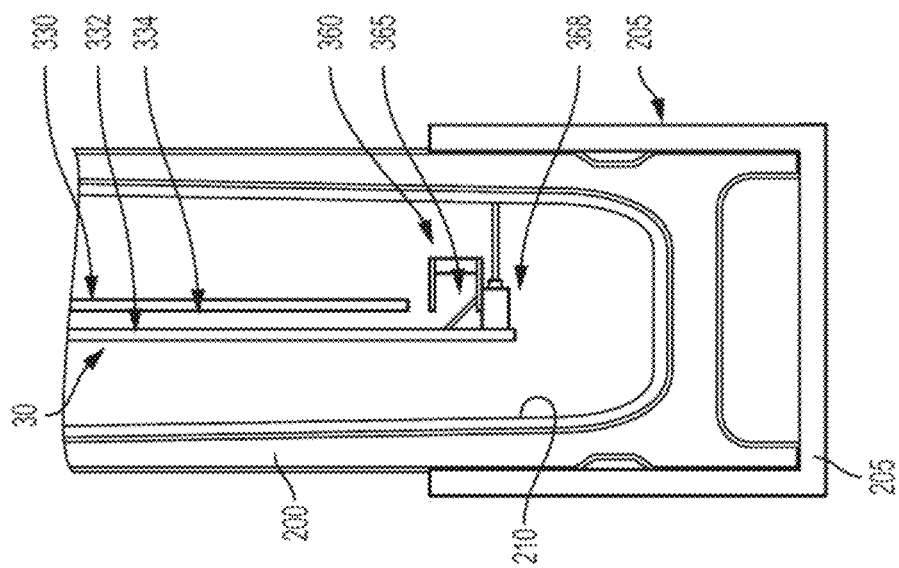
Figure 4A:
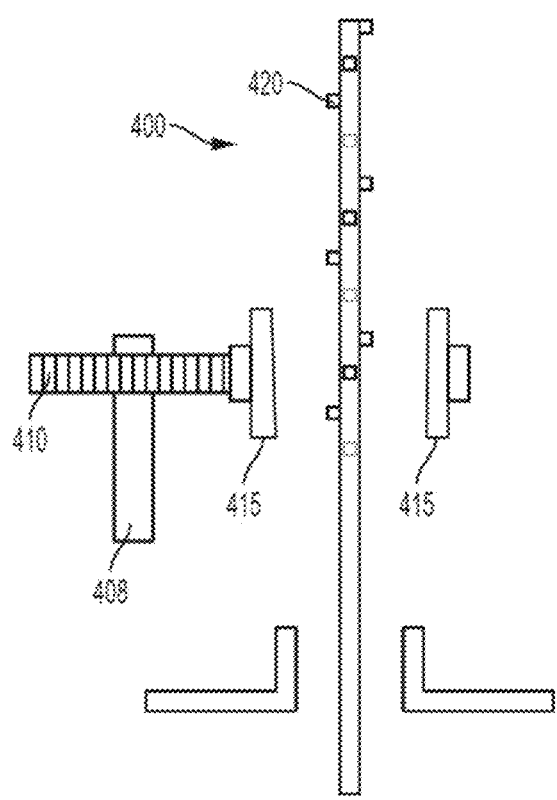
FIGS. 4A and 4B illustrate various stages of a process for use of a device for deposition of a chemical etchant agent on an interior surface of a hollow object in accordance with certain aspects of the presently disclosed invention.
Figure 4B:
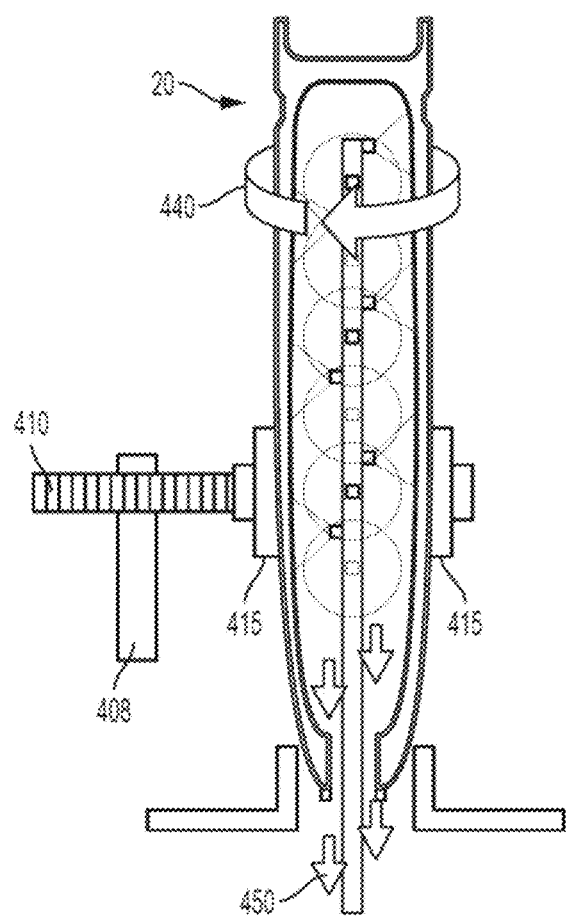

Alternatively, the system may include a mounting stage 205, as generally shown in FIGS. 2A and 3A, which supports the hollow object vertically. As shown in FIG. 2D, the mounting stage may provide rotational movement (arrow 240) and/or longitudinal movement (i.e., vertically up or down along the direction of arrow 250b) of the hollow object. Opposite this mounting stage may be an additional stage or support for the scribing device (shown as a laser in FIGS. 2A and 2D), which may provide rotational movement (arrow 240) and/or longitudinal movement (i.e., vertically up or down along the direction of arrow 250b) of the scribing device.

Described below are several exemplary devices and methods according to the presently disclosed invention for pattern generation. Such devices and methods include at least mechanical scribing and peeling, laser ablation, and photoresist processes.

a. Mechanical Scribing and Peeling Process and Device

According to certain aspects of the presently disclosed invention, at least a portion of the coating on the inner surface of the hollow object may be removed in a specific pattern using mechanical scribing. Such mechanical scribing may be accomplished by use of a device according to the present invention.

With specific reference to FIGS. 1A-1D, a scribing device according to the present invention is shown, generally designated by reference number 10. The device 10 includes at least one scribing blade, and preferably two independent scribing blades (110a, 110b) mounted in a blade holder 106. The blade holder 106 may support as many blades, angled in as many directions, as are necessary to achieve the desired pattern. When the coating is to be scribed and peeled, it is typical for two scribing blades to be positioned adjacent one another to cut parallel lines outlining the area to be peeled. As such, the distance between adjacent scribing blades may be varied so that different thicknesses of outlined areas may be produced. Such variation may be manual, may be preset on the blade holder 106, or may be automated and controlled by an automated controller.

Figure 1B:
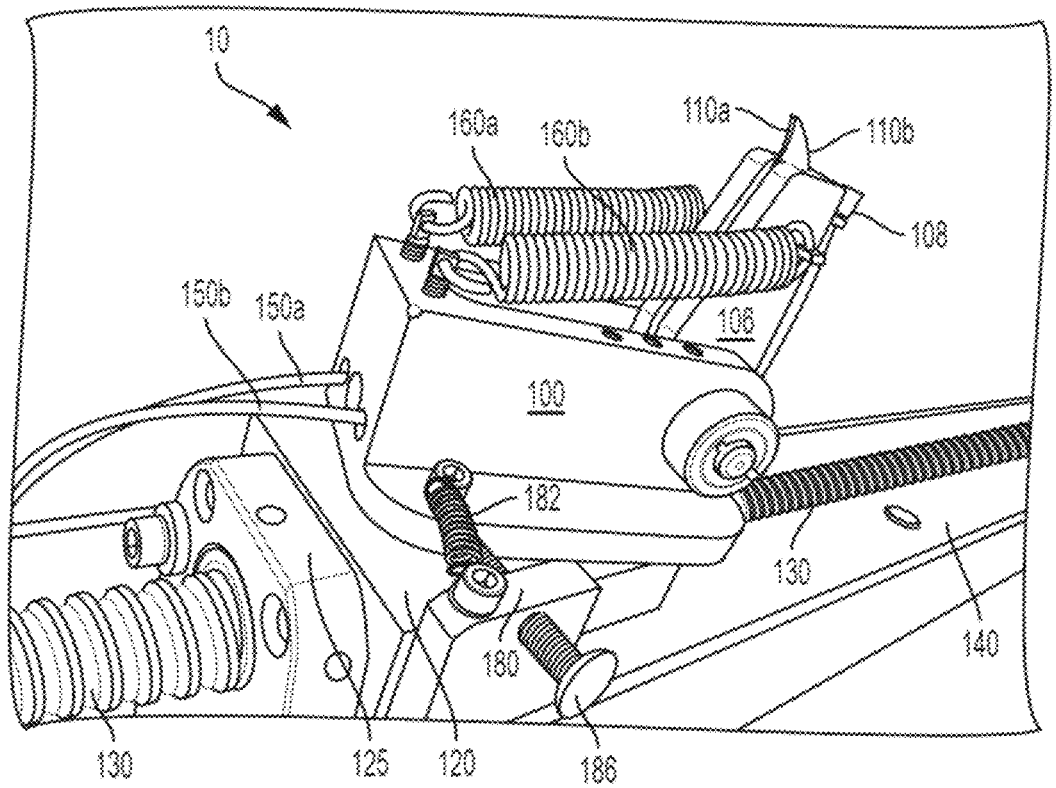
FIG. 1B illustrates an opposite side perspective view of the mechanical scribing device shown in FIG. 1A.
Figure 1C:
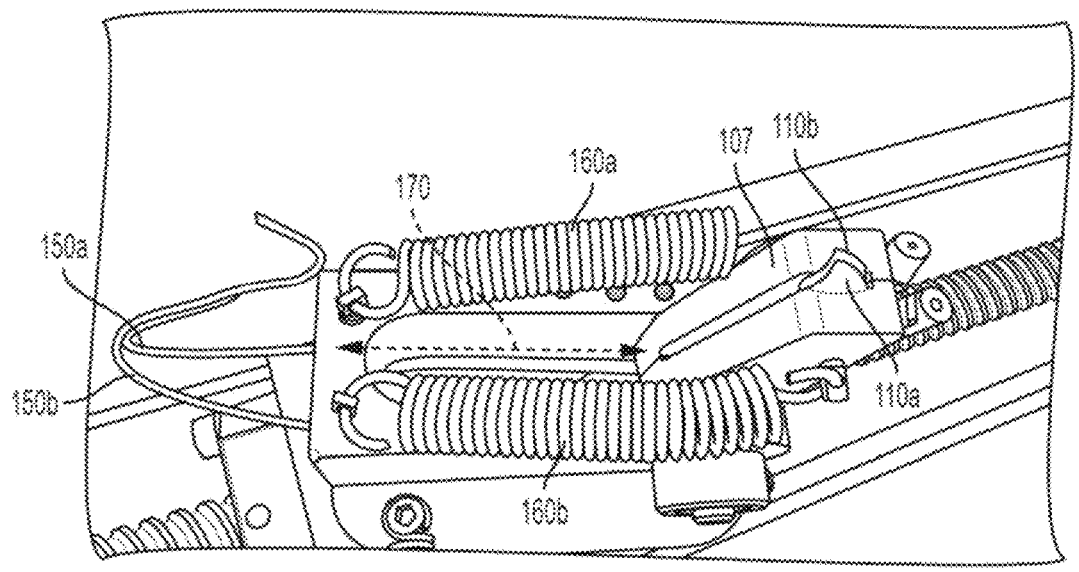
FIG. 1C illustrates a top view of the mechanical scribing device shown in FIG. 1A.
Figure 1D:
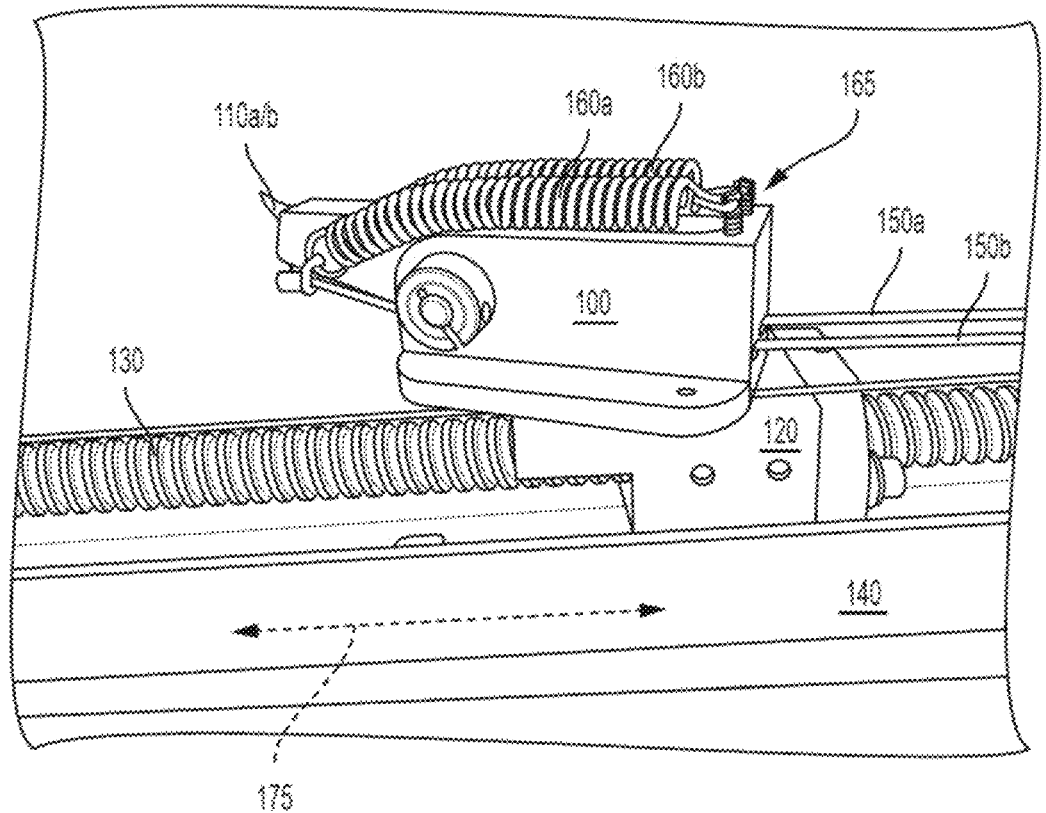
FIG. 1D illustrates a side view of the mechanical scribing device shown in FIG. 1A in a retracted position

The blade holder 106 may be rotatably attached to a cutting head 100 at a distal end of the cutting head 100. Rotation of the blade holder 106 may be about an axis which is perpendicular to a longitudinal axis 170 of the cutting head 100. At least one tensioning spring (160a, 160b) may be used to tension the blade holder 106 to an engaged position on the cutting head 100, as shown in FIGS. 1A-1C. The blade holder 106 may be adjusted to a retracted position, as shown in FIG. 1D, using at least one adjustment cord (150*a*, 150*b*) which counters the tensioning force of the at least one tensioning spring (160*a*, 160*b*) and places the blade holder 106 in a position substantially parallel with the longitudinal axis 170 of the cutting head 100. The engaged position of the blade holder 106 may be substantially perpendicular to the longitudinal axis 170 of the cutting head 100. A stop or other mechanical block may be included on the cutting head 100 to limit the engaged position of the blade holder 106 to the substantially perpendicular position.

According to certain aspects of the presently disclosed invention, the scribing blade(s) (110*a*, 110*b*) may be standard or modified surgical blades, which may be used to ensure minimal friction and standardized scribing results.

One end of the tensioning spring(s) (160*a*, 160*b*) may be attached to the blade holder 106 at a distal end of the blade holder 106, and/or proximal to the scribing blade(s) (110*a*, 110*b*). This attachment point may be along sides of the blade holder 106, as shown in FIGS. 1A-1D, or may be on an inner surface 107 of the blade holder 106. The opposite end of the tensioning spring(s) (160*a*, 160*b*) may be attached to a proximal end (165 of FIG. 1D) of the cutting head 100. In this way, the tensioning spring(s) (160*a*, 160*b*) may provide tension that holds the blade(s) (110*a*, 110*b*) engaged with, i.e., in contact with, the inner surface of the object during mechanical scribing (i.e., biases the blade holder 106 to the engaged position). The tension may be adjusted to account for varying coating thickness and/or hardness by replacing the tensioning springs (160*a*, 160*b*) with springs that have a different spring rate.

The blade holder 106 may be "retracted" by countering the tension of the tensioning springs (160*a*, 160*b*) using one or more adjustment cord(s) (150*a*, 150*b*). That is, the adjustment cord(s) (150*a*, 150*b*) may provide a pulling force counter to the direction of tension provided by the tensioning spring(s) (160*a*, 160*b*). One end of the adjustment cord(s) (150*a*, 150*b*) may be attached to the blade holder 106, such as on an outer surface of the blade holder 106 opposite the inner surface 107, and proximal to the scribing blade(s) (110*a*, 110*b*), such as along position 108. An opposite end of the adjustment cord(s) (150*a*, 150*b*) may be attached to a motor or other manual pulling device (not shown). As shown in FIG. 1B, the adjustment cord(s) (150*a*, 150*b*) may be directed through a path that keeps the cord(s) in position during use. As such, the adjustment cord(s) (150*a*, 150*b*) may be used to adjust a position of the blade holder 106 and scribing blade(s) (110*a*, 110*b*) through an arc that extends from the engaged position of the blade holder 106 to the retracted position of the blade holder 106.

While springs and/or cables are shown to provide the tension and counter force needed to position the scribing blades, other means to accomplish this action are envisioned and within in the scope of the present invention. For example, a motor/gear driven apparatus may be used to position the cutting blades between retracted and engaged positions. Furthermore, if space permits, pneumatic or hydraulic cylinders could be used to engage and disengage the blades with the object's interior to contact the inner surface.

The cutting head 100 may be attached to a stage 120 that is operably connected to a rail 130 which allows lateral movement of the stage 120. As shown in FIGS. 1A-1D, the rail 130 may be a screw and the stage 120 may be part of, or mounted on, a ball screw nut 125 which provides lateral movement of the stage 120 when the screw 130 is rotated by motor 625. Further, the device may include a platform 140 which supports ends of the rail 130 and may further enable varying degrees of tension to be actuated between the scribing blades (110*a*, 110*b*) and the inner surface of the hollow object. The ball screw nut 125 may rotate within the stage 120, or the stage may be supported by the platform 140. That is, the stage 120 may ride on edges or sides of the platform 140 so that the stage 120 does not rotate with the rotation of the ball screw nut 125 on the screw (rail 130). In this way, smooth lateral movement of the blade holder 106, cutting head 100, and stage 120 may be enabled and driven manually or by a motor (e.g., the stepper motor 625 of FIGS. 6A-6B; lateral movement is along a longitudinal axis 175 of the platform 140). The motor may be speed controlled by an operator or by an automated controller, such as speed controller 635 shown in FIGS. 6A-6B.

As discussed above, and shown in FIGS. 1A-1D, the rail 130 may be a screw and the stage 120 may be attached to the screw via a ball screw nut 125 which provides lateral movement of the stage. Alternatively, lateral movement of the stage 120 may be actuated by a pulley system, belt drive, linear thruster, electric or pneumatic cylinder, or by any means known in the art. In the case of a pulley system, the rail 130 may be used to hold the stage 120 in a specific position (e.g., by inclusion of guides), and the platform 140 may be optional. Alternatively, the stage 120 may ride on edges or sides of the platform 140, and the rail 130 may be optional.

The cutting head 100 may be rotatably mounted on the stage 120 to provide rotation of the cutting head 100, and thus the scribing blade(s) (110*a*, 110*b*), about an axis perpendicular to the longitudinal axis 175 of the stage 120/platform 140. The position of the cutting head 100 with respect to the stage 120 may be fixed, such as by a set screw 186, as shown in FIG. 1B, or by a pair of set screws (not shown). For example, an arm 180 may be used to support a set screw 186 which acts as a mechanical stop, and a spring 182 may be used to limit rotation of the cutting head 100 away from the limiting position set by the set screw 186. As indicated above, while a specific exemplary implementation is described herein above, other means to accomplish rotation of the scribing blade(s) (110*a*, 110*b*) with respect to the stage 120 or rail 130 are envisioned and within the scope of the present invention. For example, rotation of the blade holder 106 on the cutting head 100 is possible, wherein a rotational position may be altered manually or may be automatically controlled, such as through motors/gears, etc. Furthermore, rotation of the cutting head 100 on the stage 120 may use motors and/or gears, and may be altered manually or may be automatically controlled.

Prior to mechanical scribing and peeling, a scribing pattern may be set by an operator. The scribing pattern may include adjusting the linear speed of the stage 120 with respect to the rail 130 and/or platform 140, and the rotational speed of the object to attain a desired pattern. The scribing blade(s) (110*a*, 110*b*) may be retracted when the blade holder 106 is placed in the retracted position using the adjustment cord(s) (150*a*, 150*b*), and the device 10 may be inserted into the hollow cavity of the object through an opening to a predetermined starting position. Mechanical scribing may then be achieved by movement of the device 10, and thus the scribing blade(s) (110*a*, 110*b*), along the inner surface of the hollowed portion of the object as the object is turned on a rotating apparatus.

The rotating apparatus 50 may be a separate portion of the device 10 (such as the mounting stage 610, roller bars 615, motor 620, and support rail 610 shown in FIGS. 6A and 6B) or may be integral with the device 10, such as a support stage (not shown) at a distal end of the platform 140 configured to support the object on a bottom surface thereof, and/or an attachment end (not shown) at a distal end of the rail which provides rotation of the object when in contact with a bottom inner surface of the object.

According to certain aspects of the presently disclosed invention, the cutting speed may be determined based on the underlying object material and coating(s) characteristics. With regard to a cylindrical object, a straight line running parallel to the center line of the object may be scribed by the straight movement of the cutting head and stage (100 & 120) from the starting point within the object, without any rotation of the underlying apparatus or object. As the cutting head and stage (100 & 120) moves along the ball screw 130, the blade(s) 110*a*, 110*b* make contact with the coated interior surface and will scribe a straight line as far as the cutting head and stage (100 & 120) is moved within the object. Alternatively, rotating the object 20 without moving the cutting head 100 will result in a circumferential line. Combining the two movements will allow a helical design to be achieved by the straight movement of the cutting head and stage (100 & 120) within the object 20 as it turns on the rotating apparatus 50. The blades 110*a*, 110*b* are easily retracted using the adjustment cord(s) (150*a*, 150*b*) as necessary to create breaks in the scribed lines.

After scribing, the cut pieces of coating may detach from the underlying material of the object (e.g., metal), and may be removed by any means known in the art. For example, high pressure air or solvent (e.g., water) may be used to blow the cut pieces out of the interior of the hollow object. This process, termed peeling, may also be accomplished with a scraping piece which may be affixed to the device 10 in place of, or mounted between, the scribing blades. Manual peeling may also be accomplished by hand using a small pick.

b. Laser Ablation

According to certain aspects of the presently disclosed invention, at least a portion of the coating on the interior surface of the hollow object may be removed in a specific pattern using a laser ablation process. This process utilizes a laser to vaporize the coating to expose the desired pattern(s). Vaporized coating gas may be exhausted away from the laser to prevent re-depositing of particles.

With reference to FIGS. 2A-2E and 3A-3B, the laser ablation system broadly consists of three parts: i) a laser body and cooling system 40; ii) an access arm 334 with reflector 365, final focusing lens 360, optional proximity sensor 368, supply gas 330 and an evacuation system 332 (collectively 30); and iii) a multi axis moveable stage 205 upon which the hollow object 20 rests. The laser body and cooling system 40 (i.e., laser source 40) generally comprises a laser generating system including any one or more of a laser diode, laser oscillator, fiber optic cable, laser resonator, laser collimator lens, etc. For example, according to certain aspects of the present invention, the laser source may general a beam that is passed via a fiber optic cable to a collimator lens housed in the region labelled with reference number 40. The reflector 365, and in some cases the focusing lens 360, may be referred to as the laser head 30.

While shown as a stage 205 that supports a base of the hollow object longitudinally (e.g., hollow object is supported in an upright vertical position), other support structures and orientations are within the scope of the presently disclosed invention. For example, the multi axis moveable stage 205 could support the hollow object 20 in a horizontal position with the laser head 30 entering through the opening 220 on a horizontal plane.

The object 20 may be placed against a reference point on the moveable stage 205 which may hold the object stationary, or may provide rotation of the object, such as shown by arrow 240, and/or may provide lateral (arrow 250*a*) and/or longitudinal (arrow 250*b*) movement of the object. In various implementations, the laser may be stationary while the object rotates/moves around it, the object may be stationary while the laser rotates/moves within it, or the laser may move in one or more dimensions while the object moves in one or more dimensions, the two sets of movements coordinated by manual manipulation or through automated controls.

The laser head 30 may be passed through an opening 220 in the object 20 (see FIG. 2A), to a specified position (FIG. 2B). A sensor 368 mounted adjacent to the reflector 365 may continuously read a distance between a coating layer 210 on an inner surface of a wall 200 of the object 20 and the reflector 365, and the moveable stage 205 may adjust the position accordingly to maintain a constant distance (i.e., the focal length) of the laser from the coating surface to be patterned (FIG. 2C). This constant focal length may provide full ablation of the coating down to the interior surface of the hollow object 20 while minimizing distortions of the ablated coating edges. The stage 205 may be rotated, and moved either laterally and/or longitudinally, to provide etching of the pattern on the interior coated surface 210 of the object (FIGS. 2D and 2E). Alternatively, or additionally, the laser head 30 may also be rotated, and moved either laterally and/or longitudinally, to provide etching of the pattern on the interior coated surface 210 of the hollow object 20.

The supply gas 330 and evacuation system 332 may be designed to pump at high volumes to effectively remove all of the vaporized coating components in real time to prevent deposition of contaminants onto the lenses. Argon gas (or other suitable gas) may be used as the supply gas to further inhibit contaminant compound formation on the lenses and to prevent the formation of compounds at the object surface that may alter the etch rate.

The dwell time of the laser beam on the coating may be dependent on both the coating characteristics and the laser characteristics (most significantly, laser intensity), and can range from several inches per minute up to three or more feet per second. Further, the desired ablation width may be driven by the laser beam width, or by additional manual or programmed patterns. For example, a narrow beam can create a wider ablation width through a program that moves the beam rapidly back and forth laterally as it progresses. This method requires a lower intensity laser than a beam already of the required final ablation width, but is limited to lower ablation speeds as a result of the necessary continual lateral movements.

To optimize a laser process for ablating (or welding, cutting, etc.), the collimated beam from the laser source may be focused by a focusing lens (converging lens). This will result in an optimal spot, a specific distance away from the lens. The distance between the lens and that optimal spot is referred to as the focal length (f) of the lens. For maximum ablation efficiency and to keep the spot size consistent, the focal length should be kept constant. This means the focus lens must be kept a fixed distance away from the surface to optimize the ablation process.

Figure 7:
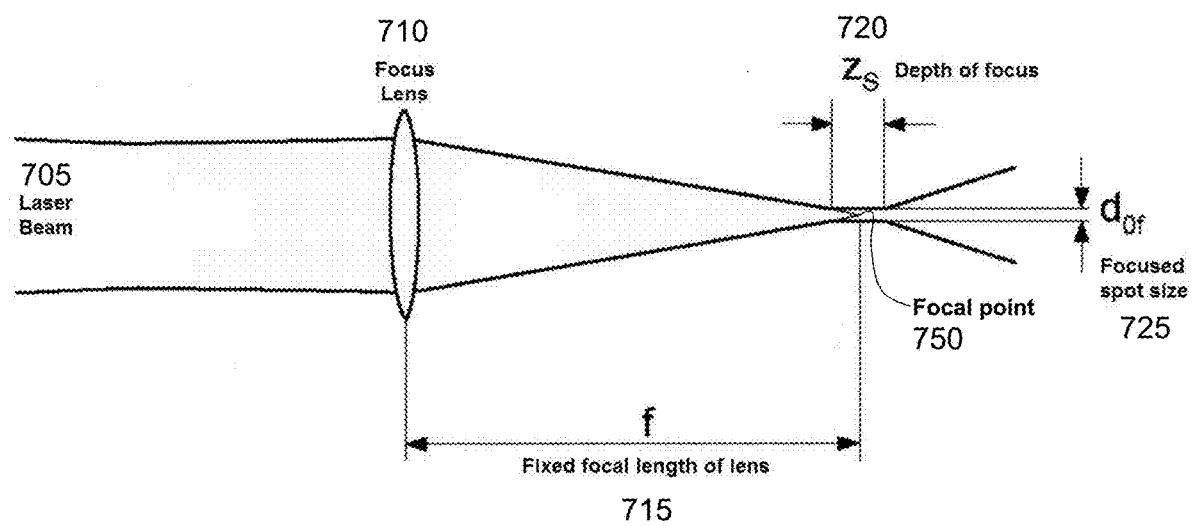
FIG. 7 illustrates the basic principles of focal length and depth of focus for an exemplary laser beam.

With specific reference to FIG. 7, a laser beam 705 may be focused to a specific focal length 715, beam diameter 725, and depth of focus 720 by a focusing lens 710, so that a focal point 750 of the beam is positioned on a surface to be patterned. As indicated above, as the distance between the focused laser beam (i.e., focusing lens 710) and the substrate to be patterned changes, the position of the laser beam relative to the substrate must also change so that the focal point 750 remains positioned, i.e., focused, on the substrate at least within the depth of focus 720. If the substrate is moved such that the beam is no longer focused on the substrate, the laser may not function efficiently or properly to ablate or add material in the defined pattern. This becomes an issue when ablating the inside of a container with a radius less than the focal length of the lens. To resolve this issue, a reflector may be inserted between the focus lens and the surface to be ablated. The sum of the distance between the focus lens and reflector and the distance between the reflector and the surface to be ablated must be equal to the focal length.

Figures 8A, 8B, 8C:
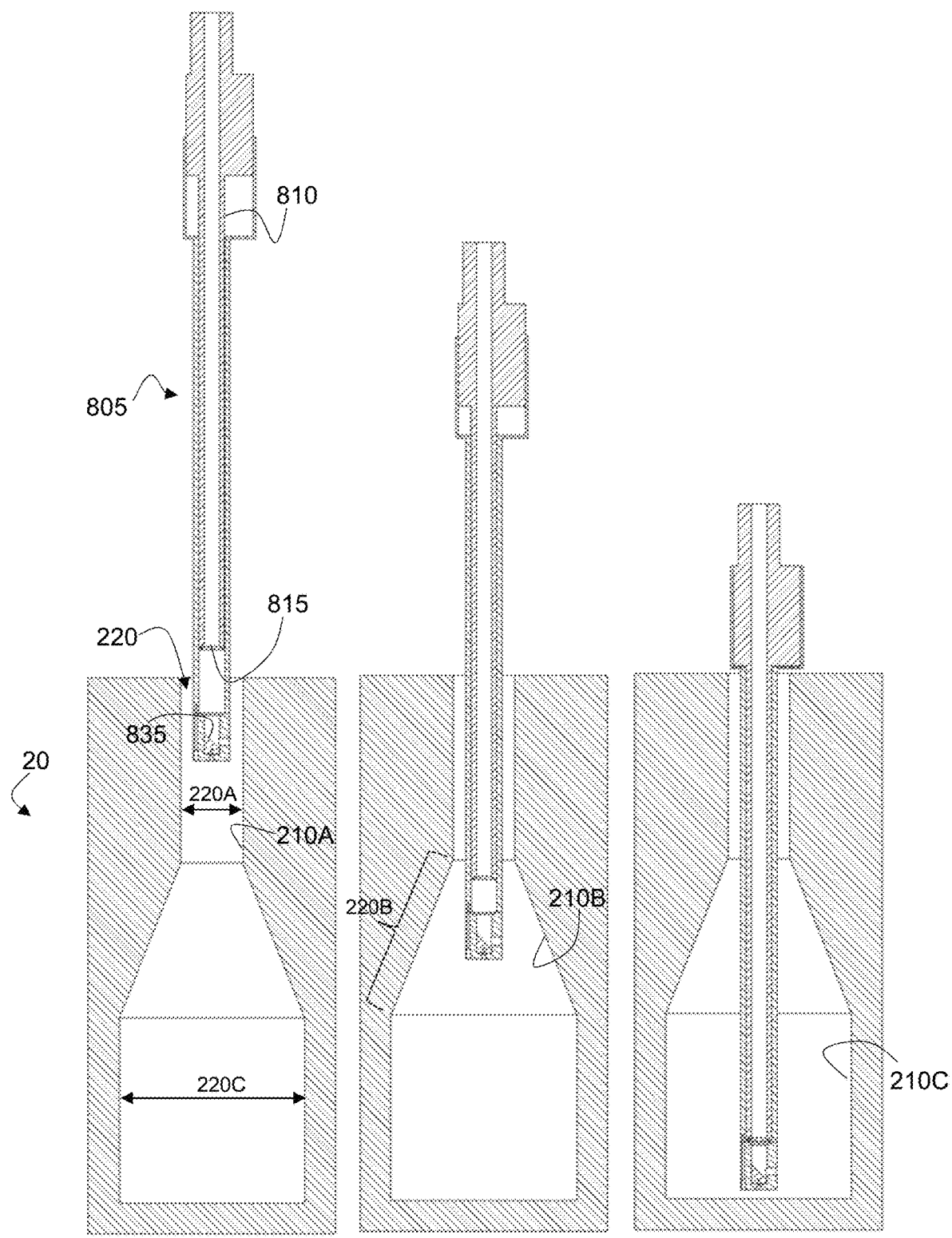
FIGS. 8A-8C illustrate various stages of entry of a laser machining device into a hollow object in accordance with certain aspects of the presently disclosed invention.

With reference to FIGS. 8A-8C, the hollow object 20 may have an internal profile defining one or more internal diameters. For example, the hollow object 20 may have an opening 220 having an internal diameter 220A that differs from a diameter of a lower or main body portion 220C of the hollow object 20. Moreover, other internal profiles of the hollow object may be non-uniform (e.g., sloped, ridges, etc.), such as region 220B. As such, a distance from the focused laser beam, such as beam 360 shown in FIG. 3B, to the interior surface of the hollow object (210A, 210B, 210C) may change as the beam is moved laterally or rotationally within the hollow object.

This change in distance, such as to distances that are greater than or smaller than the focal length 715 of the laser beam 705, may be accommodated by changing the focusing lens 710 to one having a different focal length 715 (i.e. focal length matched to the distance between the focusing lens 710 and the substrate). Such a solution would not be feasible, however, for patterning inclined or non-uniform surfaces, such as the sloped surface 210B shown in FIGS. 8A-8C.

Alternatively, as shown in FIG. 2D, a stage on which the hollow object rests (e.g., the moveable stage 205 of FIG. 2A) may provide lateral (arrow 250a) movement of the object, or the laser head 30 may be moved laterally to be closer to or farther away from the surface to be patterned. If, however, the opening 220 is small, such movement may not be possible as the amount of lateral movement 250a required may exceed the diameter of the opening 220. The presently disclosed invention solves this problem by providing a system that changes the lateral position of the focal point 750 without changing the lateral position of the laser head 30 or the focal length 715 of the focused laser beam.

Figures 9A, 9B, 9C:
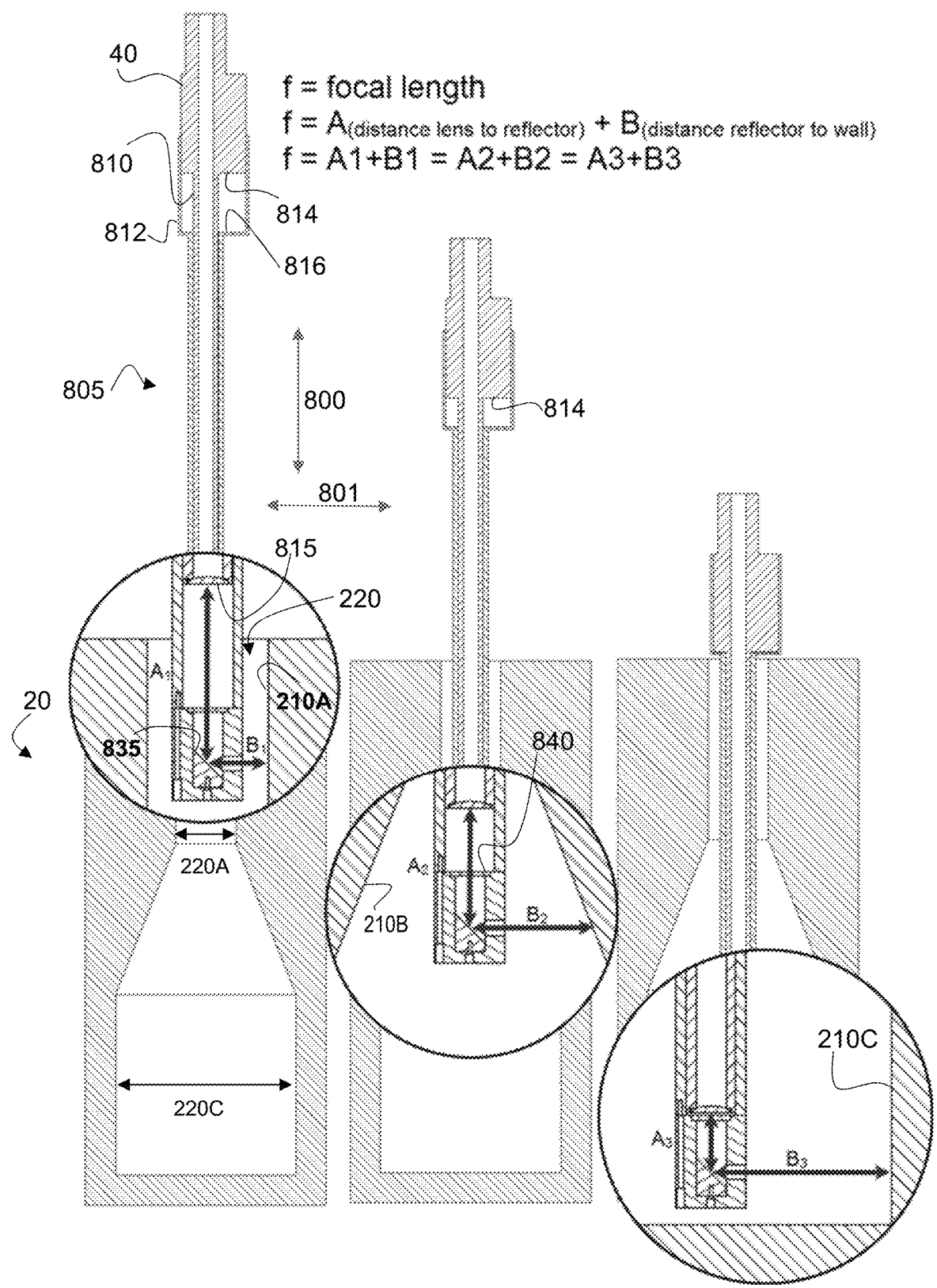
FIGS. 9A-9C illustrates adjustment of a laser machining device of the presently disclosed invention to accommodate variations in distance between the device and a substrate.

With reference to FIG. 9A, the laser beam may be focused by a lens (focusing lens 815) and deflected toward the substrate surface 210A by a reflector 835. To deflect the focused laser beam by 90 degrees, a reflector 835 positioned at an angle of 45 degrees to the laser beam (705 of FIG. 7) may be used, as shown in FIG. 9A (i.e., angled 45 degrees to the longitudinal axis of the laser system). The focal length f of the focused laser beam is therefore the distance A from the focusing lens 815 to the reflector 835 plus the distance B from the reflector 835 to the focal point of the lens (i.e., see 750 in FIG. 7). Optimally, the second distance B will equal the distance between the reflector 835 and the inner wall of the hollow object 210A so that the focal point 750 is focused on the inner wall of the hollow object 210A. Thus, as shown in FIG. 9A, the focal length f may equal $A_1+B_1$.

While a specific angle for positioning of the reflector 835 is indicated, i.e., 45 degrees, other angles are possible and within the scope of the presently disclosed invention. For example, the reflector 835 may be positioned at different angles to change the distance B from the reflector 835 to the focal point of the lens, or to position the focal point of the lens around or past an internal feature in the way of the straight path of the lens (i.e., overhanging feature).

As indicated in FIG. 9A-9C, the inner wall of the hollow object 20 may have a non-uniform shape, and thus the distance between laser head 30 and the reflector 835 may not remain constant. For an exemplary hollow object 20, the inner wall may slope outward, such as shown for region 220B in FIG. 9B, so that the reflector 835 is now further from the inner wall 210B. In FIG. 9C, the diameter 220C of a lower region of the exemplary hollow object 20 may be greater than the diameter 220A of an opening 220 of the hollow object 20 such that lateral movement of the laser head (including the laser arm 805 and laser source 40) may not compensate for the increased distance $B_3$. In this case, in order to maintain the relationship f=A+B, when the distance B becomes larger, the distance A must be made inversely smaller. Thus, as shown in FIGS. 9B and 9C, as the laser head 30 moves longitudinally into the interior of the hollow object, and the distance between the reflector 835 and the inner wall of the hollow object A changes, the distance B between the focusing lens 815 and the reflector 835 will also be changed:

$$f=A_1+B_1=A_2+B_2=A_3+B_3$$

As indicated, the distances A and B are inversely proportional so that the focal length f remains constant.

According to certain aspects of the presently disclosed invention, the distances A and B may be varied by changing a distance between the focusing lens 815 and the reflector 835. The presently disclosed laser system may include an inner tube 810 comprising the laser source 40 or at least a collimating lens at a distal end, and a focusing lens 815 at a proximal end (e.g., laser generator connected to collimator lens via a fiber optic cable). This inner tube 810 may be moveably nested within an outer tube 812 comprising the reflector 835 at a distal end, wherein the focusing lens 815 is positioned closest to the reflector 835. In this manner, longitudinal movement (i.e., arrow 800) of the inner tube 810 within the outer tube 812 will change the distance A between the focusing lens 815 and the reflector 835. As the distance A changes, for example to become shorter, the distance B between the reflector 835 and the focal point of the laser beam may also change (i.e., become longer). As such, the laser beam may remained focused on the inner surface of the hollow object without lateral movement of the laser system (arrow 801).

As shown in more detail in FIGS. 9A and 9B, the outer tube 812 may include one or more stops or surfaces (816, 840) which limit the longitudinal motion of the inner tube 810 therein. For example, a protruding surface 814 of the inner tube 810 may contact an inner surface 816 of the outer tube 812. This stop acts to provide a lower limit to the distance A, and as such defines the maximal length of the distance B ($B_3$ in FIG. 9C). Similar physical stops (not shown) or electronic stops may be provided which place an upper limit on the distance A, and thus provide a minimal length for the distance B. Accordingly, the range of distance B is only limited by the positioning of the stops which limit movement of the focusing lens 815 relative to the reflector 835, and/or the maximal focal length of the focusing lens 815. As such, methods for patterning an interior surface of a hollow object may be accomplished using the presently disclosed laser system and a single focusing lens.

In certain circumstances, objects having very large changes in the internal diameter may need to be patterned, wherein the differences in diameter may exceed the maximal/minimal length of the distance B provided by a single focusing lens. Thus, additional focusing lenses may be used, wherein a motion control system may assist in patterning those regions accessible by the system having a first focusing lens during a first patterning cycle, and those regions accessible by the system having a second focusing lens in a second patterning cycle, etc.

Figure 10:
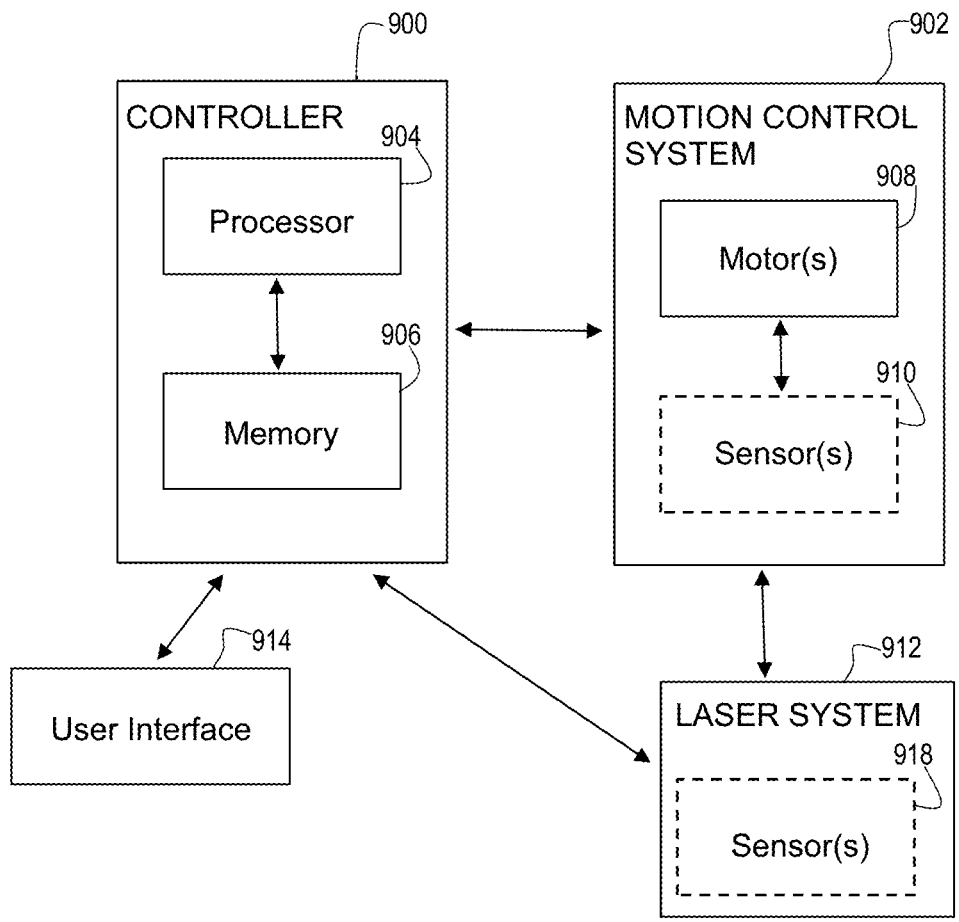
FIG. 10 is a block diagram of a system for scribing or machining according to certain aspects of the presently disclosed invention.

The linear motion between the inner tube 810 and the outer tube 812 may be actuated by a ball screw controlled by a servo motor, which may be in electronic communication with a server (controller 900 in FIG. 10). The server may be configured to store or receive dimensional data of an internal shape of the hollow object, and control the servo motor based on the dimensional data. While a specific means for providing linear motion of the inner tube relative to the outer tube, e.g. a ball screw actuated by a servo motor, is disclosed herein, additional means for providing this movement are known in the art and within the scope of the presently disclosed invention.

The laser system shown in FIGS. 9A-9C may be adjusted using a motion control system which may be a separate part of the overall system, or may be part of the system that controls rotational and translational motions about the longitudinal axis of the hollow object and/or the laser system. That is, the motion control system may provide rotation about a longitudinal axis and translation along the longitudinal axis (i.e., depth of entry of the laser head into the interior of the hollow object) for one or both of the hollow object and the laser system based on the complex pattern. The motion control system may also change a positional relationship between the reflector 835 and the focusing lens 815 to accommodate a change in a distance between the reflector 835 and the interior surface of the hollow object so that the focal point of the laser system remains focused on the interior surface.

The change in the positional relationship may be based on real-time dimensional data of the distance between the reflector and the interior surface of the hollow object collected by a position sensing device attached to the laser system. An exemplary position sensing device is shown in FIG. 3A (368), and measures a real-time distance to a substrate. The term real-time may be understood as a time scale consistent with the time scale of the laser machining methods disclosed herein, so that the focal point of the laser may remain focused on the substrate as the laser head is moved to different positions on the substrate.

As shown in FIG. 10, an exemplary system for laser machining according to the present invention may include a laser system 912 (laser source, collimator, focusing lens, reflector, etc.), a motion control system 902, a controller 900, and a user interface 914. A memory 906 of the controller 900 may store computer-executable instructions executable by the processor 904, and configured to direct motor(s) 908 of the motion control system 902 to adjust the positional relationship between the reflector 835 and the focusing lens 815 based on the real-time dimensional data acquired by the sensor(s) 918 of the laser system 912 (motor 908 may include the servo motor that actuations the screw ball connecting the inner 810 and outer 812 tubes of the laser system). Additional sensors 910 may be included as part of the motional control system for verification of object placement and/or movement, and/or laser system position and/or movement.

Alternatively, the change in the positional relationship may be based on dimensional data of an interior shape of the hollow object stored on a server. The controller 900 may store the dimensional data on a memory 906, along with computer-executable instructions configured to direct motor(s) 908 of the motion control system 902 to adjust the positional relationship between the reflector 835 and the focusing lens 815 based on the stored dimensional data. A user interface 914 may be included that may provide direct user communication with the controller 900, and may provide a means to input dimensional data related to a specific hollow object.

According to certain aspects of the presently disclosed invention, the stored dimensional data may be data acquired and stored from previous "scans" of a hollow object, such as from the sensor 910 during a prior ablation process, and may include a map of an internal shape of the hollow object, or a map of the internal shape of the hollow object in only those regions relevant for machining the complex pattern.

The adjustment mechanism disclosed herein may provide a system capable of changing the lateral position of the focal point of a laser without changing the lateral position of the laser head or the focal length of the focused laser beam. By making the distance between the focusing lens and reflector adjustable, the system can accommodate containers of assorted sizes subject to the focal length of the specified lens. This adjustability also allows for laser patterning or ablation inside of tapered containers (or containers with changing radius) by moving the focusing lens away from the reflector as the surface gets closer to the reflector or by moving the focusing lens towards the reflector as the surface gets further away from the reflector. The adjustability of the focus lens can be motorized and programmable based upon a container's design.

As such, the presently disclosed systems may be able to pattern the interior surfaces for objects that were previously not possible using the methods and system so the prior art. For example, for a hollow object having a small opening having a diameter less than an interior diameter of a main body portion of the hollow object, it would not have been possible to move the entire laser head 30 to a position within the small opening that would maintain the laser focused on the interior surface of the lower interior regions of the hollow object.

Accordingly, the present invention relates to methods for forming a complex pattern on an interior surface of a hollow object having a small opening, wherein a diameter of the small opening of the hollow object may be 90%, 80%, 70%, 60%, 50%, 40%, 30%, 20%, 10% or less than an interior diameter of the hollow object. The method comprises passing a laser system through the small opening of the hollow object so that a focal point of the laser system is focused on the interior surface of the hollow object, wherein the laser system comprises a reflector to angle the focal point ninety degrees with respect to a longitudinal axis of the laser system onto the interior surface of the hollow object. Both rotational and/or translational movement are provided along a longitudinal axis for one or both of the hollow object and the laser system based on the complex pattern. The laser system is then operated to form the complex pattern on the interior surface of the hollow object. A longitudinal distance between the reflector of the laser system and a focusing lens of the laser system may be changed to accommodate a change in a lateral distance between the reflector and the interior surface of the hollow object so that the focal point remains focused on the interior surface.

The adjustment of the longitudinal distance between the reflector and the focusing lens may be provided by a motion control system based on real-time dimensional data of the distance between the reflector and the interior surface of the hollow object collected by a position sensing device attached to the laser system, or based on dimensional data of an interior shape of the hollow object stored on a server.

An exemplary laser incorporates a 250-500 mm effective focal length, 0.040" focused point diameter, 1 kW fiber pulsed laser, with flattop beam shaping for uniform ablation across the removal width. This method permits the same flexibility in interior pattern design as mechanical scribing and peeling, but may provide greater accuracy and efficiency as the laser process may be more highly automated and computer driven, permitting tighter tolerances and significantly shorter processing times.

While the pattern generation detailed hereinabove has been discussed in terms of systems and methods for patterning interior surfaces of hollow objects, the systems and methods are equally applicable to patterning exterior surfaces. For example, rather than supporting the object to be patterned on a rotating apparatus 50 such as shown in FIG. 6A, wherein the patterning device is supported on a rail 130 that enters the hollow cavity, the object may be support in a manner wherein the patterning device maintains access to an exterior of the object (e.g., displace support 50 and rail 130 laterally).

c. Photoresist Process

According to certain aspects of the presently disclosed invention, at least a portion of the coating on the interior surface of the hollow object may be removed in a specific pattern using a photoresist process. This process utilizes a laser, much as described above, though possibly at lower intensity and at differing wavelength, to expose the desired patterns onto a photoresist coating that is compatible (resistant to) the chosen etchant.

Photoresists can be broadly divided into two types; positive acting and negative acting. With a negative acting photoresist, the coating may be applied and dried at specific conditions, but is not yet cross-linked or "cured." Exposure to a specific wavelength of electromagnetic radiation (EMR) energy, typically in the UV range of the spectrum, causes the resist to cross-link where exposed, becoming insoluble to the specific developing solution. The areas not exposed to the specific EMR energy will freely wash away when exposed to a developing solution, exposing the substrate material (surface of the object) to allow for etching.

With a positive acting photoresist, the dried coating exhibits the opposite behavior as described above. The positive acting photoresist will become soluble where exposed to the EMR energy, and remain insoluble where not exposed. According to certain aspects of the present invention, a device similar to the laser ablation device described herein, though at differing energy wavelength and intensity, may be used with a positive photoresist process for internal etching. As described, the device may be automated to provide highly efficient and accurate pattern formation on the interior surface of a hollow object. That is, the patterns may be preset or programmed into a computer (e.g., translated from CAD drawings) which directs movement of the laser head 30 and movement of the object 20 on the moveable stage 205 (see FIGS. 3A and 3B), either individually (the laser within the stationary object, or the object around a stationary laser), or together.

After exposure to the laser, the pattern may be developed using the appropriate chemistry. For the positive photoresist process, this development step removes the photoresist in the areas required to be etched to reveal the underlying object surface. After the pattern has been developed, the photoresist may be hardened using the appropriate method (chemical, light exposure, temperature, etc.) to keep it from washing away during etching.

The equipment for exposing the pattern into the photoresist is similar to the laser ablation system, but produces a beam of the correct wavelength to expose the photoresist, typically runs at significantly lower intensities (as it only needs to crosslink chemistry and not vaporize the coating), may not require a gas supply and exhausting (as no vaporized particles are created), and may not need edge sensing feedback and continuous positioning correction to preserve the laser focal length, as more latitude in exposure is typically expected for this type of processing. The laser system would still consist of, at a minimum: i) a laser body and potentially a cooling system; ii) an access arm with reflectors and final focusing lenses; and iii) a multi axis moveable stage upon which the object rests. The object may be placed against a reference point on the moveable stage.

In addition to the laser exposure steps outlined above, this method may also require two additional steps: i) Developing and ii) Hardening (each defined below). In some instances, the addition of these two steps may cause this alternative to be both costlier and more time consuming than laser ablation.

The developing process generally consists of dipping the object in a chemical, and/or spraying the chemical into the hollow interior of the object, to dissolve the uncured or non-cross-linked photoresist and reveal the underlying surface in the selected pattern ("developing"). Parameters and developing chemistry generally vary with photoresist characteristics and thickness.

After developing, the remaining resist may be fixed in place ("hardening") to prevent it from being washed away during the upcoming etching process. Depending upon the resist selected, this may be accomplished chemically, thermally, or with a combination of the two. The chemical hardening process generally consists of spraying or filling the hollow interior of the object with a chemical which reacts with the resist to cause it to become insoluble to the selected etchant. Spraying apparatus such as detailed below, and shown in FIGS. 4A-4B and 5A-5E may be used. The thermal hardening process is generally accomplished by baking the object with the resist coating at an elevated temperature for a prescribed length of time. Parameters and hardening chemistry will vary with photoresist characteristics and thickness. Care must also be taken when using thermal hardening to ensure that the process is compatible with the substrate as to not affect its physical properties.

iii) Etching

The patterned object, whether produced through laser ablation, mechanical scribing and peeling, or by a photo resist process may be placed on a motor driven, speed controlled, rotary stage with spray headers which may be matched to an interior cavity geometry of the hollow object. With specific reference to FIGS. 4A-4B, the object 20 may be supported by a strap or belt 415 having a gear that may interact with a secondary gear 410. As such, rotation of the object, shown as arrow 440, may be driven by an axle 408 and motor (not shown). Alternatively, the object 20 could be supported on a stage, such as stage 205 shown in FIGS. 2A-2E.

A spray header 400 having various nozzles 420 may be placed within the interior cavity of the object 20 to provide an etchant solution to the inner surface of the object. The design of the spray header 400 (and nozzles 420) must be carefully evaluated for specific object geometries and etchants.

In designing the spray header 400 to deliver the etching solution to the inner surface of the object 20, several design considerations were studied:

The etch rate, which may depend, in part, on the spray pressure of the nozzles 420 in the header 400, the spray volume of those nozzles 420, or both. Further, the spray volume (flow rate) of the nozzles 420, which is a function of spray pressure. Moreover, if internal pressure is applied to assist in evacuation of the spent etchant from the interior of the object, the spray pressure in the nozzles 420 and/or the spray volume of those nozzles 420 may need to be adjusted to counter the internal pressure.

The type of nozzle 420, which may affect the etch rate and etch pattern. Full cone nozzles, in either round or square configuration, are generally considered the optimal pattern, as they result in the highest continuous coverage of etch solution at the inner surface.

The placement of the nozzles 420 on the spray header 400, which may be configured to maximize coverage while minimizing destructive interference between individual nozzle cones. For ferric chloride etching of the internal surface of cylindrical objects, for example, a helical arrangement of nozzles was found to be optimal.

Movement of the object 20, which may be configured to occur with respect to the nozzles 420 to minimize the effect of the pressure (and flow) differential that occurs from the direct cone center, where pressure is highest, to points further out the radius of the cone, where pressure decreases further out toward the edges. For a cylindrical object with a helical nozzle arrangement, the movement may incorporate rotating the object around the spray header, while simultaneously oscillating the spray header vertically the same distance as the vertical distance between nozzles on the spray header.

While designing the spray header for etch rate and uniformity, several constraints were also considered:

While maximizing flow rate and pressure may improve etch rates, doing so may come at the expense of larger spray nozzles. For a cylindrical spray header etching a cylindrical object, the maximum diameter of the nozzles mounted on the header must be smaller than the opening through which the spray header must travel. This may require specialized nozzles, designed and fabricated or modified for the particular application.

The spray header itself must be of a small enough diameter to allow for insertion into the object with nozzles inserted (as above), but the inside diameter must be large enough to accommodate the flow rate of etch solution necessary to minimize pressure differential between the nozzles on the header. That is, the inside diameter should be sufficiently large to allow fluid velocity to be maintained at relatively low levels (<20 ft/sec).

The outside diameter of the header should be small enough to allow sufficient open area between the outer diameter (OD) of the header and the inner diameter (ID) of the object opening, to allow spent or reacted etch solution to flow back out of the object. If the open area is too small to allow the spent etchant to escape under gravity alone, then a small diameter pressure tube may be fixed to the spray header and extend beyond the end of the spray header into the object. This pressure tube may then be pressurized with a suitable gas to pressurize the inside cavity, forcing the spent etchant out at an accelerated rate versus gravity alone.

Many of the design factors and constraints are in direct opposition to each other, and so the design of a specific spray header system will be matched to the individual application, and the factors optimally balanced against each other for the exact conditions of that application.

Some combinations of etchants, substrates, and process variables may create patterns in the depth of substrate removed. This is referred to as "banding" due to its visual appearance. Banding can be minimized by either moving the spray header or object on the longitudinal axis. The amount of movement will depend on the distance between the nozzles, and the frequency of movement should be out of sync with the rotational speed of the object.

The etch chemistry may be matched to the particular material of the object and coating, and may be designed to optimize for the desired final pattern attributes (depth, final width, surface roughness, etc.). The etchant may be sprayed through the nozzles 420 against the interior surface of the object. The parameters at which the etch solution itself is provided (e.g., temperature, density, spray pressure, etc.) may be customized to achieve the final pattern attributes. The etching solution dissolves the material exposed through the preceding processes, as the etching process mills into the internal surface of the object along the pattern scribed.

In the case of a cylindrical object, the object may be placed on a rotating stage with an adjustable rotation rate, such as 6 rpm. This rotation rate may be adjusted upward depending on the object diameter. Larger diameter objects may have larger internal circumferences requiring faster rotational speeds to maintain the same etch rate as smaller diameter objects.

For example, ferric chloride may be used as an etchant for ferrous alloys, sprayed at 5-300 pounds per square inch (psi) at a temperature of 70-200° F. and specific gravity of 1.10-1.50. For example, ferric chloride may be sprayed at a pressure of 80 psi, a temperature of 140° F., and a specific gravity of 1.30. However, any etchant appropriate to the underlying object surface and selected coating may be used to facilitate this step of the method.

Etching parameters may change depending on the etchant chemistry and material of the object being etched. Higher spray pressures may be required for materials that contain components, or produce etching byproducts, that are insoluble to the selected etchant. For example, some steels contain higher concentrations of silicon, which is insoluble in ferric chloride, and will require higher pressures to mechanically remove the silicon to keep it from decreasing or completely blocking the etching reaction. Depending on the material composition and the final pattern geometry, this process can take anywhere from 10 minutes to over 8 hours.

According to certain aspects of the present invention, the object may be submerged in the etch solution for a prescribed time period to achieve the desired material removal. Submersion allows uniform removal of the metal to a desired depth where the coating was removed without the need for a specialized spray header.

According to certain aspects of the present invention, if the object material is electrically conductive or can be made to be electrically conductive, an electrochemical etching (EChE) process may be used. In such an instance, the coating may be an electrical insulator, and the patterned object may be flooded with an electrolytic solution and may have a cathode inserted in the opening such that the cathode does not make contact with the object. The hollow object may thus act as the anode, such that when an electric current passes through the electrolyte (between the anode and cathode), the surface of the hollow object in the exposed pattern is etched, i.e., the current will etch the exposed pattern by "plating" the object material, acting as the anode in this case, toward the inserted cathode in an electrochemical etching process.

The cathode may be shaped to match the general contour of the internal surface to maintain constant distance and therefore constant resistance between the cathode and anode, or a simple geometric shaped cathode such as a cylinder may be used and compensated with an insulating coating or cover applied selectively to achieve constant resistance across the cathode-anode gap. In such a process, newly introduced electrolyte may be moved rapidly through the anode-cathode gap and out into an external tank so that the removed material flows out into a settling tank instead of plating to the inserted cathode. Alternatively, the removed material may simply be plated onto the cathode.

According to certain aspects of the present invention, the interior surface of the object can be electrochemically plated in a similar but opposite fashion as described above, wherein the object is the cathode and the anode is made of the desired plating material. Current passes through the object to the anode resulting in the exposed interior surface of the object being plated with the desired material. The process and equipment for electrochemical plating is well-known in the art but has been limited to flat plates, such as circuit boards and glass, entire surfaces of objects, or easily accessible surfaces. The aforementioned process would allow detailed designs to be plated on the interior of objects with restricted access such as pipes, tubes and conduits. Plating patterns on the internal surfaces of a pipe could result in increased flow turbulence, effectively an integrated static mixer, or if desired improving laminar flow around high precision in-line instrumentation, reducing the need for long straight runs of piping before the sensor element.

The EChE process detailed herein differs from electro-chemical machining (ECM) where the desired pattern are formed primarily by the shape of the cathode in close proximity to the work-piece surface.

iv) Finishing

The inventive processes described above may further include a multi-step finishing procedure. Once etching is complete, the object may be rinsed clean of all residual etchant or electrolyte and placed in a bath of stripping solution (a solvent matched to the coatings) to remove all remaining coating material. Alternatively, a wet blast process consisting of high pressure sprays of a solution containing a suitable aggregate component could be used in place of the stripping solution to mechanically remove the coating from the object. After the remaining coating is removed ("stripping"), the object may be thoroughly pressure-washed and dried in preparation for any required final surface treatments. Such treatment typically consists of passivation and/or oil coating for ferrous alloy metal parts. Other materials may require other treatments.

Figure 5E:
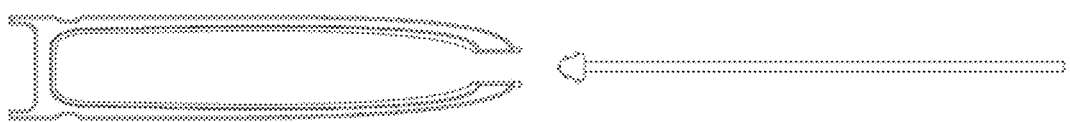
FIGS. 5A-5E illustrate various stages of a process for use of a device for deposition of a coating, or stripping agent on an interior surface of a hollow object in accordance with certain aspects of the presently disclosed invention.
Figure 5D:
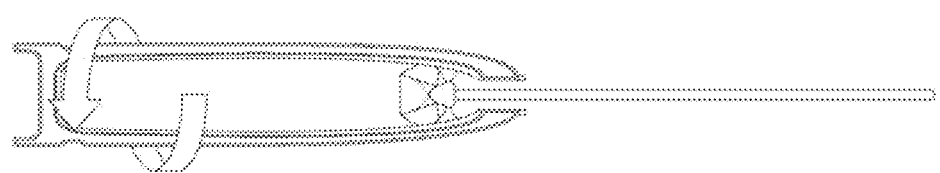
Figure 5C:
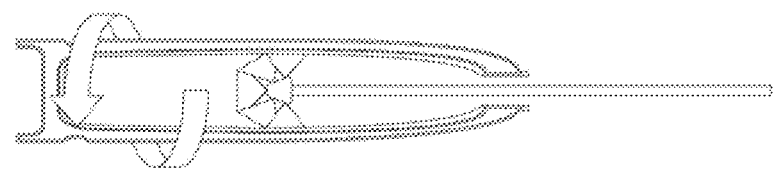
Figure 5B:
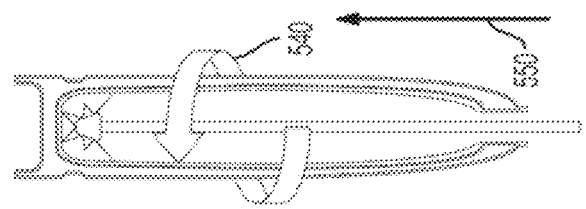
Figure 5A:
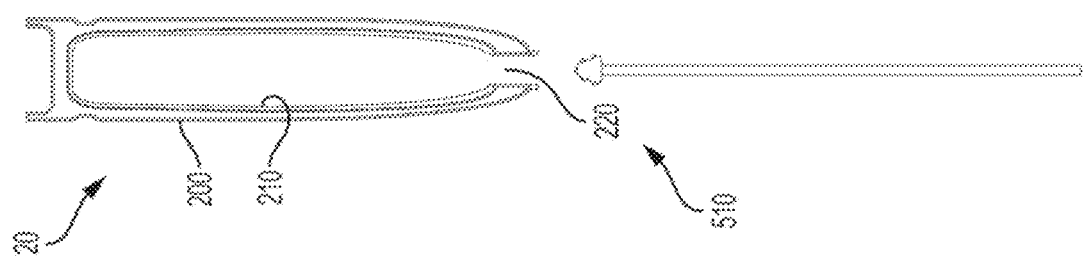

With reference to FIG. 5A-5E, such a process may include passing a high pressure spray head 510 through an opening 220 in the object 20 (see FIG. 5A) to a defined position (see FIG. 5B). As shown in the figures, the object 20 may be supported on a stage that provides rotation, such as shown by arrow 540, and longitudinal movement, such as shown by arrow 550 (see FIG. 5C-5E). Alternatively, the spray head 510 may be moveable in a longitudinal and rotational manner to enable positioning of the spray head 510 within the interior of the object.

The spray head 510 may be activated to provide a solution (e.g., water stripping solution) or solid material (e.g., sand, aluminum oxide, etc.) at a high pressure to an inner surface 210 of the object 20.

While the presently disclosed invention has been described in detail, it should be appreciated by those skilled in the art that various modifications and alternations and applications could be developed in light of the overall teachings of the disclosure. Accordingly, the particular systems and methods disclosed are meant to be illustrative only and not limiting as to the scope of the invention.

For example, the presently disclosed methods and devices may be useful for etching patterns on the interior walls of specialized piping. Piping flow could be manipulated by applying etch patterns, either to decrease turbulence thereby increasing fluid flow efficiency, or conversely to increase turbulence for mixing purposes by effecting a disruption in the pipe wall.

Moreover, both additive and removal processes, using any of laser ablation, mechanical scribing and peeling, and photo resist methods, are highly customizable for the purpose of accommodating novel shapes and space restrictions and such customizations based on shape and space are contemplated in these descriptions. Furthermore, laser ablation can be mated with computer automated systems and software to enable full automation of cutting with a controls platform that allows for easy modification of the ablation path and such mating is likewise contemplated herein. Finally, though developed in the context of ferrous alloy metal objects, the processes herein described are for broad application for use in objects comprised of any material whatsoever.

What is claimed is:

1. A method for forming an etched pattern on an interior surface of a hollow object, the method comprising:
    positioning a laser system within the hollow object so that a focal point of the laser system is focused on the interior surface of the hollow object; and
    operating the laser system to form a pattern on the interior surface of the hollow object,
    wherein motion of one or both of the laser system and the hollow object is controlled by a motion control system configured to provide:
    (a) rotation about a longitudinal axis, translation along the longitudinal axis, or both for either or both of the hollow object and the laser system based on the pattern, and
    (b) adjustment of a positional relationship between a reflector of the laser system and a focusing lens of the laser system to accommodate a change in a distance between the reflector and the interior surface of the hollow object so that the focal point remains focused on the interior surface, wherein the change in the distance between the reflector and the interior surface is caused by a non-uniform shape of the interior surface of the hollow object.

2. The method of claim 1, wherein an amount of adjustment of the positional relationship is inversely proportional to the distance between the reflector of the laser system and the interior surface of the hollow object.

3. The method of claim 1, wherein the motion control system provides adjustment of the positional relationship based on real-time dimensional data of the distance between the reflector of the laser system and the interior surface of the hollow object collected by a position sensing device.

4. The method of claim 1, wherein the motion control system provides adjustment of the positional relationship based on dimensional data of an interior shape of the hollow object stored on a server.

5. The method of claim 1, further comprising, before positioning the laser system within the hollow object:
    applying a coating which resists etchants or acts as an electrical insulator to the interior surface of the hollow object.

6. The method of claim 5, wherein operating the laser system to form the pattern on the interior surface of the hollow object comprises ablating the coating in the pattern.

7. The method of claim 5, wherein the coating is a photoresist, and the method further comprises, after operating the laser system to form the pattern on the interior surface of the hollow object:
  treating the photoresist with a developing chemical to remove the photoresist in the pattern.

8. The method of claim 5, further comprising, after operating the laser system to form the pattern on the interior surface of the hollow object:
  etching the interior surface of the hollow object in the pattern by an electrochemical etching (EChE) process, wherein the EChE process comprises exposing the interior surface of the hollow object to an electric current in the presence of an electrolyte solution.

9. The method of claim 5, further comprising, after operating the laser system to form the pattern on the interior surface of the hollow object:
  etching the interior surface of the hollow object in the pattern by a chemical etching process, wherein the chemical etching process comprises applying an etching agent that chemically mills the interior surface of the hollow object in the pattern.

10. The method of claim 9, wherein applying the etching agent comprises:
  submerging the hollow object in the etching agent for a period of time sufficient to mill the interior surface in the pattern to a desired depth; or
  spraying the etching agent from a spray header, wherein during spraying the etching agent from the spray header, the hollow object, the spray header, or both are rotated.

11. The method of claim 5, wherein applying the coating to the interior surface of the hollow object comprises:
  applying the coating through a spray gun to the interior surface of the hollow object until a desired coating thickness is achieved, wherein the spray gun, the hollow object, or both rotate;
  pouring the coating into an interior of the hollow object and rotating the hollow object at a speed sufficient to provide a uniform coating distribution in the interior surface thereof;
  pouring the coating into the interior of the hollow object in an amount sufficient to fill the interior of the hollow object, and inverting the hollow object to allow the coating to drain;
  or a combination thereof.

12. The method of claim 5, further comprising:
  applying the coating to an exterior surface of the hollow object.

13. The method of claim 1, wherein the laser system includes:
  an inner tube comprising the focusing lens at a distal end and a collimator at a proximal end, and
  an outer tube comprising the reflector at a distal end,
  wherein the inner tube is nested within the outer tube with the focusing lens closest to the reflector, and wherein changing the positional relationship between the reflector and the focusing lens is moving the distal end of the inner tube closer to the distal end of the outer tube.

14. The method of claim 13, wherein moving the distal end of the inner tube closer to the distal end of the outer tube is actuated by a ball screw controlled by a motor that is part of the motion control system.

15. The method of claim 13, wherein the reflector is mounted at the distal end of the outer tube at a first angle so that the focal point of the laser system is redirected by a second angle toward the interior surface of the hollow object.

16. The method of claim 15, wherein when the first angle is about 45 degrees, the second angle is about 90 degrees.

17. A method for machining an interior surface of a hollow object, the method comprising:
  positioning a laser system within the hollow object so that a focal point of the laser system is focused on a coating applied to the interior surface of the hollow object;
  operating the laser system to machine a pattern in the coating on the interior surface of the hollow object; and
  etching or plating the interior surface of the hollow object in the pattern by an electrochemical etching (EChE) process, wherein the EChE process comprises exposing the interior surface of the hollow object to an electric current in the presence of an electrolyte solution,
  wherein motion of the laser system and the hollow object is controlled by a motion control system configured to:
  provide rotation about a longitudinal axis, translation along the longitudinal axis, or both for either or both of the hollow object and the laser system based on the pattern, and
  change a positional relationship between a reflector of the laser system and a focusing lens of the laser system to accommodate a change in a distance between the reflector and the interior surface of the hollow object so that the focal point of the laser system remains focused on the coating applied to the interior surface, wherein the change in the positional relationship is based on real-time dimensional data of the distance between the reflector and the coating applied to the interior surface of the hollow object collected by a position sensing device attached to the laser system, or based on dimensional data of an interior shape of the hollow object stored on a server.

18. The method of claim 17, wherein the laser system includes:
  an inner tube comprising the focusing lens at a distal end and a collimator at a proximal end, and
  an outer tube comprising the reflector at a distal end,
  wherein the inner tube is nested within the outer tube with the focusing lens closest to the reflector, and wherein changing the positional relationship between the reflector and the focusing lens is moving the distal end of the inner tube closer to the distal end of the outer tube by actuation of a ball screw controlled by a motor that is part of the motion control system.

19. A method for forming a pattern on an interior surface of a hollow object having a small opening, the method comprising:
  passing a laser system through the small opening of the hollow object so that a focal point of the laser system is focused on the interior surface of the hollow object, wherein the laser system comprises a reflector to angle the focal point with respect to a longitudinal axis of the laser system onto the interior surface of the hollow object;
  providing rotational movement, translational movement, or both along the longitudinal axis for one or both of the hollow object and the laser system based on the pattern;
  operating the laser system to form the pattern on the interior surface of the hollow object; and
  changing a longitudinal distance between the reflector of the laser system and a focusing lens of the laser system to accommodate a change in a lateral distance between the reflector and the interior surface of the hollow object so that the focal point remains focused on the interior surface, wherein the change in the distance between the reflector and the interior surface is caused by a non-uniform shape of the interior surface of the hollow object,
wherein a diameter of the small opening of the hollow object is less than an interior diameter of the hollow object.

* * * * *